United States Patent [19]

Ogawa et al.

[11] Patent Number: 4,460,670
[45] Date of Patent: Jul. 17, 1984

[54] PHOTOCONDUCTIVE MEMBER WITH α-SI AND C, N OR O AND DOPANT

[75] Inventors: Kyosuke Ogawa, Tokyo; Shigeru Shirai, Yamato; Junichiro Kanbe, Yokohama; Keishi Saitoh, Tokyo; Yoichi Osato, Yokohama, all of Japan

[73] Assignee: Canon Kabushiki Kaisha, Tokyo, Japan

[21] Appl. No.: 443,164

[22] Filed: Nov. 19, 1982

[30] Foreign Application Priority Data

Nov. 26, 1981 [JP] Japan ................... 56-190038
Nov. 30, 1981 [JP] Japan ................... 56-193201
Dec. 1, 1981 [JP] Japan ................... 56-194293

[51] Int. Cl.$^3$ ............................................. G03G 5/082
[52] U.S. Cl. ........................................... 430/57; 430/84; 430/85; 430/86; 430/95; 252/501.1; 427/74; 357/2
[58] Field of Search ................. 430/57, 84, 85, 86, 430/95; 252/501.1; 427/74; 357/2

[56] References Cited

U.S. PATENT DOCUMENTS

| | | | |
|---|---|---|---|
| 3,210,184 | 10/1965 | Uhlig | 430/65 |
| 4,217,374 | 8/1980 | Ovshinsky et al. | 430/84 X |
| 4,226,898 | 10/1980 | Ovshinsky et al. | 430/84 X |
| 4,239,554 | 12/1980 | Yamazaki | 136/255 |
| 4,251,289 | 2/1981 | Moustakas et al. | 204/192 |
| 4,253,882 | 3/1981 | Dalal | 427/74 X |
| 4,265,991 | 5/1981 | Hirai et al. | 430/65 X |
| 4,289,822 | 9/1981 | Shimada et al. | 427/74 X |
| 4,414,319 | 11/1983 | Shirai et al. | 430/65 |

FOREIGN PATENT DOCUMENTS

| | | | |
|---|---|---|---|
| 55-29154 | 3/1980 | Japan | 136/258 |
| 2083701 | 3/1982 | United Kingdom | 357/2 |

*Primary Examiner*—Roland E. Martin, Jr.
*Attorney, Agent, or Firm*—Fitzpatrick, Cella, Harper & Scinto

[57] ABSTRACT

A photoconductive member comprises a support for a photoconductive member and an amorphous layer having photoconductivity constituted of an amorphous material comprising silicon atoms as a matrix, said amorphous layer having a first layer region containing at least one kind of atoms selected from the group consisting of oxygen atoms, carbon atoms and nitrogen atoms as constituent atoms in a distribution which is ununiform and continuous in the direction of layer thickness and a second layer region containing atoms of an element belonging to the group III of the periodic table as constituent atoms in a distribution which is ununiform and continuous in the direction of layer thickness.

52 Claims, 8 Drawing Figures

PHOTOCONDUCTIVE MEMBER WITH α-SI AND C, N OR O AND DOPANT

BACKGROUND OF THE INVENTION

1. Field of the Invention

This invention relates to a photoconductive member having sensitivity to electromagnetic waves such as light [herein used in a broad sense, including ultraviolet rays, visible light, infrared rays, X-rays, gamma-rays, and the like].

2. Description of the Prior Arts

Photoconductive materials, which constitute solid image pick-up devices, or image forming members for electrophotography and manuscript reading apparatuses, in the field of image formation, are required to have a high sensitivity, a high SN ratio [photocurrent $(I_p)$/Dark current $(I_d)$], spectral characteristic matching to those of electromagnetic waves to be irradiated, a rapid response to light, a desired dark resistance value and no harm to human bodies during usage. Further, in a solid image pick-up device it, is also required that the residual image should easily be treated within a predetermined time. In particular, in case of an image forming member for electrophotography to be assembled in an electrophotographic device to be used in an office as an office business machine, the aforesaid harmless characteristics is very important.

From the standpoint as mentioned above, amorphous silicon [hereinafter referred to as "a-Si"] has recently attracted attention as a photoconductive material. For example, German Laid-Open Patent Publication Nos. 2746967 and 2855718 disclose applications of a-Si for use in image forming members for electrophotography, and German Laid-Open Patent Publication No. 2933411 an application of a-Si for use in a photoelectric transducer reading device.

However, under the present situation, the photoconductive members having photoconductive layers constituted of a-Si of prior art are required to be improved in a balance of overall characteristics including various electrical, optical and photoconductive characteristics such as dark resistance value, photosensitivity and response to light, etc., hot repeated use characteristic, and further stability with lapse of time.

For instance, when the a-Si photoconductive member is applied to an image forming member for electrophotography, residual potential is frequently observed to remain during use thereof if improvements to higher photosensitivity and higher dark resistance are scheduled to be effected at the same time. When such a photoconductive member is repeatedly used for a long time, there will be caused various inconveniences such as accumulation of fatigues by repeated uses, so called ghost phenomenon resulting from the accumulation of fatigues wherein residual images are formed, and the like.

Further, according to the experience by the present inventors from a number of experiments, a-Si material constituting the photoconductive layer of an image forming member for electrophotography, have a number of advantages, as compared with inorganic photoconductive materials such as Se, CdS, ZnO, and the like or organic photoconductive materials such as PVCz, TNF and the like of prior art, but it is also found that they have several problems to be solved. Namely, when charging treatment is applied, for formation of electrostatic images, to the photoconductive layer of an image forming member for electrophotography having a photoconductive member constituted of a mono-layer of a-Si which has been endowed with characteristics for use in a solar battery of the prior art, dark decay is markedly rapid, whereby it is difficult to apply a conventional electrophotographic method.

Further, in case that a photoconductive layer is constituted of a-Si, a-Si materials may contain, as constituent atoms, hydrogen atoms or halogen atoms such as fluorine atoms, chlorine atoms, and the like, for improving their electrical and photoconductive characteristics, boron atoms, phosphorous atoms, and the like, for controlling the electroconduction type, and other atoms for improving other characteristics. Depending on the manner in which these constituent atoms are contained, there may sometimes be caused problems with respect to electrical, optical or photoconductive characteristics of the layer formed.

That is, for example, in many cases, the life of the photocarriers generated by light irradiation in the photoconductive layer formed is insufficient, or at the dark portion, the charges injected from the support side cannot sufficiently impeded.

Thus, it is required in designing a photoconductive material to make efforts to obtain desirable electrical, optical and photoconductive characteristics as mentioned above along with the improvement in a-Si materials per se.

SUMMARY OF THE INVENTION

The present invention has been achieved to solve the above mentioned problems. The studies have been made comprehensively from the standpoints of applicability and utility of a-Si as a photoconductive member for image forming members for electrophotography, solid image pick-up devices, reading apparatuses, and the like. It has now been found that a photoconductive member having a photoconductive layer comprising an amorphous layer exhibiting photoconductivity, which is constituted of so called hydrogenated amorphous silicon, halogenated amorphous silicon or halogen-containing hydrogenated amorphous silicon which is an amorphous material containing at least one of hydrogen atom (H) and halogen atom (X) in a matrix of a-Si, especially silicon atoms [hereinafter referred to comprehensively as a-Si (H,X)], said photoconductive member being prepared by designing so as to have a specific layer structure, exhibits not only practically extremely excellent characteristics but also surpass the photoconductive members of the prior art in substantially all respects, especially exhibiting markedly excellent characteristics as a photoconductive member for electrophotography. The present invention is based on such finding.

The object of the present invention is to provide a photoconductive member having constantly stable electrical, optical and photoconductive characteristics, which is markedly excellent in light fatigue resistance.

Another object of the present invention is to provide a photoconductive member excellent in durability without causing any deterioration phenomenon after repeated uses and free entirely or substantially from residual potentials observed.

Another object of the present invention is to provide a photoconductive member having excellent electrophotographic characteristics, which is sufficiently capable of retaining charges at the time of charging treatment for formation of electrostatic images to the extent such that a conventional electrophotographic method can be very effectively applied when it is provided for use as an image forming member for electrophotography.

Still another object of the present invention is to provide a photoconductive member for electrophotography capable of providing easily a high quality image which is high in density, clear in halftone and high in resolution.

Further, another object of the present invention is to provide a photoconductive member having high photosensitivity, high SN ratio characteristic and good electrical contact with a support.

According to the present invention, there is provided a photoconductive member comprising a support for a photoconductive member and an amorphous layer having photoconductivity constituted of an amorphous material a-Si comprising silicon atoms as a matrix, characterized in that said amorphous layer has a first layer region containing at least one kind of atoms selected from the group consisting of oxygen atoms, carbon atoms and nitrogen atoms as constituted atoms in a distribution which is ununiform and continuous in the direction of layer thickness and a second layer region containing atoms of an element belonging to the group III of the periodic table as constituent atoms in a distribution which is ununiform and continuous in the direction of layer thickness.

DESCRIPTION OF THE PREFERRED EMBODIMENTS

Figure 1:
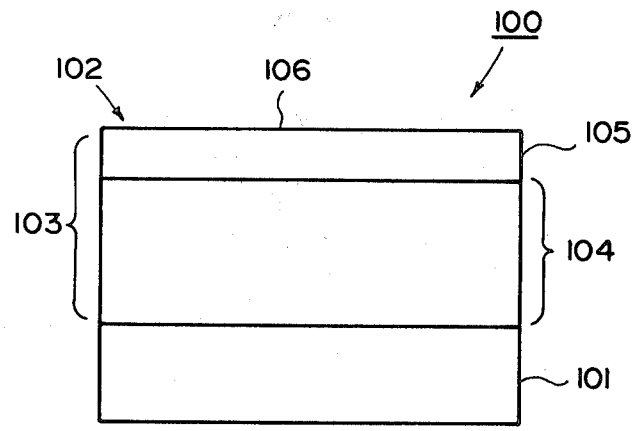
FIG. 1 shows a schematic sectional view for illustration of the layer constitution of preferred embodiment of the photoconductive member according to the present invention.

Referring now to the drawing, the photoconductive members according to the present invention are to be described in detail below.

FIG. 1 shows a schematic sectional view for illustration of a typical exemplary layer constitution of the photoconductive member of this invention.

The photoconductive member 100 as shown in FIG. 1 has a support 101 for photoconductive menber and an amorphous layer 102 comprising a-Si, preferably a-Si (H,X) having photoconductivity provided on the support. The amorphous layer 102 has a layer structure constituted of a first layer region (O, N, C) 103 containing at least one kind of atoms selected from the group consisting of oxygen atoms, nitrogen atoms and carbon atoms, a second layer region (III) 104 containing atoms of an element belonging to the group III of the periodic table as constituent atoms and a surface layer region 105 containing no atom of an element belonging to the group III of the periodic table on the second layer region (III) 104.

Each of atoms selected from the group consisting of oxygen atoms, carbon atoms and nitrogen atoms contained in the first layer region (O, N, C) 103 is distributed in said layer region (O, N, C) 103 continuously in the direction of the layer thickness in an ununiform distribution, but preferably in a distribution continuous and uniform in the direction substantially parallel to the surface of the support 101.

In the photoconductive member 100 as shown in FIG. 1, there is provided a layer region 105 containing no atom of an element belonging to the group III at the surface portion of the amorphous layer 102. Said layer region 105 is not essential in the present invention, but may be optionally provided. That is, for example, the first layer region (O, N, C) 103 may be the same layer region as the layer region (III) 104, or alternatively the second layer region (III) 104 may be provided within the first layer region 103. The group III atoms contained in the second layer region (III) 104 are distributed in said second layer region (III) 104 continuously in the direction of the layer thickness in an ununiform distribution, but preferably in a distribution continuous and uniform in the direction substantially parallel to the surface of the support 101.

In the photoconductive member according to the present invention, improvements to higher dark resistance and to better adhesion between the amorphous layer and the support on which it is directly provided are intended preponderantly by incorporation of at least one kind of atoms selected from the group consisting of oxygen atoms, carbon atoms and nitrogen atoms in the first layer region (O, N, C).

In the present invention, better results may be obtained in case of layer structures, especially where as shown in the photoconductive member 100 in FIG. 1, the amorphous layer 102 has a first layer region (O, N, C) 103 containing at least one kind of atoms selected from the group consisting of oxygen atoms, carbon atoms and nitrogen atoms, a second layer region (III) 14 containing the group III atoms, and a surface layer region 105 containing no atom of the group III, said first layer region (O, N, C) 103 and said second layer region (III) 104 sharing a common layer region.

In the photoconductive member of the present invention, the distribution of each of oxygen atoms, carbon atoms and nitrogen atoms incorporated in the first layer region (O, N, C) 103 is made in the first place more concentrated toward the support 101 or the side bonded to another layer for ensuring good adhesion and contact with the support 101 or another layer. Secondly, it is preferred that the aforesaid three kinds of atoms should be incorporated in the first layer region (O, N, C) 103 so that they may be gradually decreased in distribution concentration toward the free surface side 106 in order to make the surface layer region 105 more sensitive to the light irradiation from the free surface side 106 of the amorphous layer 102, until the distribution concentration may become substantially zero at the free surface 106. As for the group III atoms to be incorporated in the second layer region (III) 104, in case of an example where none of said group III atoms are incorporated in the surface layer region 105 of the amorphous layer 102, it is preferred that the group III atoms may be formed in a distribution such that, in order to make the electrical contact between the second layer region (III) 104 and the surface layer region 105 smooth, distribution concentration of the group III atoms within the second layer region (III) 104 should be decreased gradually toward the direction of the surface bonded to the surface layer region 105 until it may become substantially zero at said bonded surface.

In the present invention, the atoms belonging to the group III of the periodic table to be incorporated in the second layer region (III) constituting the armorphous layer may include B (boron), Al (aluminum), Ga (gallium), In (indium), Tl (thallium), and the like. Among them, B and Ga are particularly preferred.

In the present invention, the content of the group III atoms in the second layer region (III), which may be suitably determined as desired so as to achieve effectively the object of the present invention, may be generally 0.01 to $5 \times 10^4$ atomic ppm, preferably 1 to 100 atomic ppm, more preferably 2 to 50 atomic ppm, most preferably 3 to 20 atomic ppm, based on silicon atoms. The content of oxygen atoms, nitrogen atoms and carbon atoms in the first layer region (O, N, C) may also be determined suitably depending on the characteristics required for the photoconductive member formed, but generally 0.001 to 30 atomic %, preferably 0.01 to 20 atomic %, more preferably 0.02 to 10 atomic %, most preferably 0.03 to 5 atomic %. When two or more kinds of oxygen atoms, nitrogen atoms and carbon atoms are contained in the first layer region (O, N, C) in the present invention, the total content of the atoms contained is determined within the numerical range as mentioned above.

FIGS. 2 through 6 show, respectively, typical examples of the distribution in the direction of layer thickness of oxygen atoms, nitrogen atoms, carbon atoms and the group III atoms contained in the amorphous layer of the photoconductive member according to the present invention.

In FIGS. 2 through 7, the axis of abscissa indicates the content C of the aforesaid three kinds of atoms contained in the first layer region (O, N, C) and the group III atoms, and the axis of ordinate the layer thickness direction of the amorphous layer exhibiting photoconductivity, $t_B$ showing the position of the surface on the support side, and $t_s$ the position of the surface on the side opposite to the support side. That is, the growth of the amorphous layer containing the aforesaid at least one kind of the three kinds of atoms and the group III atoms proceeds from the $t_B$ side toward the $t_s$ side.

The scale of the axis of abscissa for the aforesaid three kinds of atoms is different from that for the group III atoms. In FIGS. 2 through 7, the solid lines A2–A4 and A7–A9, and the solid lines B2–B4 and B7–B9 represent distribution concentration lines of the aforesaid three kinds of atoms and of the group III atoms, respectively.

Figure 2:
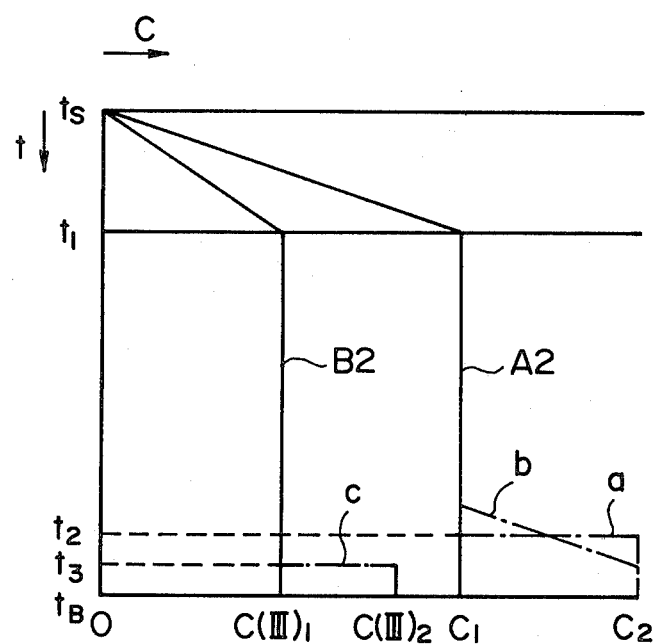
FIGS. 2 through 7 schematic sectional views for illustration of the layer constitutions of the amorphous layer constituting the photoconductive member of the present invention, respectively.

In FIG. 2, there is shown a first typical embodiment of the distribution of the aforesaid three kinds of atoms and the group III atoms in the layer thickness direction contained in the amorphous layer.

According to the embodiment as shown in FIG. 2, the amorphous layer ($t_s\ t_B$) (the whole layer region from $t_s$ to $t_B$) comprising a-Si, preferably a-Si (H,X) and exhibiting photoconductivity, has a layer region ($t_1\ t_B$) (the layer region between $t_1$ and $t_B$) wherein the atoms (M) selected from oxygen atoms, nitrogen atoms and carbon atoms are distributed at a distribution concentration of $C_1$ and the group III atoms at a distribution concentration of $C_{(III)1}$ substantially uniformly in the layer thickness direction from the support side, and a layer region ($t_s\ t_1$) wherein the aforesaid atoms (M) are gradually decreased linearly in distribution concentration from $C_1$ to substantially zero and the group III atoms decreased linearly in distribution concentration from $C_{(III)1}$ to substantially zero.

In case of the embodiment as shown in FIG. 2, where the amorphous layer ($t_s\ t_B$) is provided on the support side and has a contact face with the support or another layer (mutually with $t_B$) and a layer region ($t_1, t_B$) in which the atoms (M) and the group III atoms are uniformly distributed, the distribution concentrations $C_{(III)1}$ and $C_1$, which may suitably be determined as desired in relation to the support or other layers, are 0.1 to $8 \times 10^4$ atomic ppm, preferably 0.1 to 1000 atomic ppm, more preferably 1 to 400 atomic ppm, most preferably 2 to 200 atomic ppm, based on silicon atoms, for $C_{(III)1}$, and 0.01 to 35 atomic %, preferably 0.01 to 30 atomic %, more preferably 0.02 to 20 atomic %, most preferably 0.03 to 10 atomic % for $C_1$.

The layer region ($t_s\ t_1$) is provided primarily for the purpose of sensitization to higher photosensitivity, and the layer thickness of said layer region ($t_s\ t_1$) should be determined suitably as desired in relation to the distribution concentration $C_1$ of the atoms (M) and the distribution concentration $C_{(III)1}$ of the group III atoms, especially the distribution concentration $C_1$.

In the present invention, the layer region ($t_s\ t_1$) provided at the surface layer region of the amorphous layer is desired to have a thickness generally of 100 Å to 10$\mu$, preferably 200Å to 5$\mu$, most preferably 500 Å to 3$\mu$.

In a photoconductive member having distributions of the atoms (M) and the group III atoms as shown in FIG. 2, for improvement of adhesion with the support or another layer as well as inhibition of charges from the support side to the amorphous layer, while also aiming at improvements to higher photosensitivity and higher dark resistance, it is preferable to provide a layer region ($t_2$ $t_B$) in which the distribution concentration of atoms (M) is made higher than the distribution concentration $C_1$ at the portion on the support side surface (corresponding to the position $t_B$) in the amorphous layer as shown by the dot-and-dash line a in FIG. 2.

The distribution concentration $C_2$ of the atoms (M) in the layer region ($t_2$, $t_B$) where the atoms (M) are distributed at a high concentration may be generally 70 atomic % or less, preferably 50 atomic % or less, most preferably 30 atomic % or less. The distribution of the atoms (M) in the layer region where the atoms (M) are distributed at higher concentrations may be made constantly uniform in the layer thickness direction as shown by the dot-and-dash line a in FIG. 2, or alternatively in order to make good electrical contact with adjacent layer region directly bonded, it may be made a constant value of $C_2$ from the support side to a certain thickness and decreased thereafter continuously and gradually to $C_1$ as shown by the dot-and-dash line b in FIG. 2.

The distribution of the group III atoms contained in the second layer region (III) may be generally made so as to give a layer region maintaining a constant value of distribution concentration $C_{(III)1}$ [corresponding to the layer region ($t_1$ $t_B$)] on the support side, but it is desirable for the purpose of inhibiting efficiently injection of charges from the support side to the amorphous layer to provide a layer region ($t_3$ $t_B$) in which the group III atoms are distributed at a high concentration as shown by the dot-and-dash line c in FIG. 2.

In the present invention, the layer region ($t_3$ $t_B$) may be preferably proivded within 5$\mu$ from the position $t_B$. The layer region ($t_3$ $t_B$) may be made the whole layer region ($L_T$) to the thickness of 5$\mu$ from the position $t_B$, or may be provided as a part of the layer region ($L_T$).

It may be suitably determined depending on the characteristics required for the amorphous layer formed, whether the layer region ($t_3$ $t_B$) should be made a part or whole of the layer region ($L_T$).

The layer region ($t_3$ $t_B$) may be desirably formed so that the group III atoms may be distributed in the layer thickness direction with the maximum distribution value (distribution concentration value) $C_{max}$ being generally 50 atomic ppm or more, preferably 80 atomic ppm or more, most preferably 100 atomic ppm or more, based on silicon atoms.

That is, in the present invention, the second layer region (III) containing the group III atoms may preferably be formed so that the maximum value $C_{max}$ of the content distribution may exist within 5$\mu$ of layer thickness from the support side (layer region of 5$\mu$ thickness from $t_B$).

In the present invention, the layer region ($t_2$ $t_B$) where the atoms (M) are distributed at higher concentration and the layer region ($t_3$ $t_B$) where the group III atoms are distributed at higher concentration may have thicknesses, which may suitably be determined depending on the contents and the distribution states of the atoms (M) or the group III atoms, may desired to be generally 50 Å to 5$\mu$, preferably 100 Å to 2$\mu$, most preferably 200 Å to 5000 Å.

Figure 3:
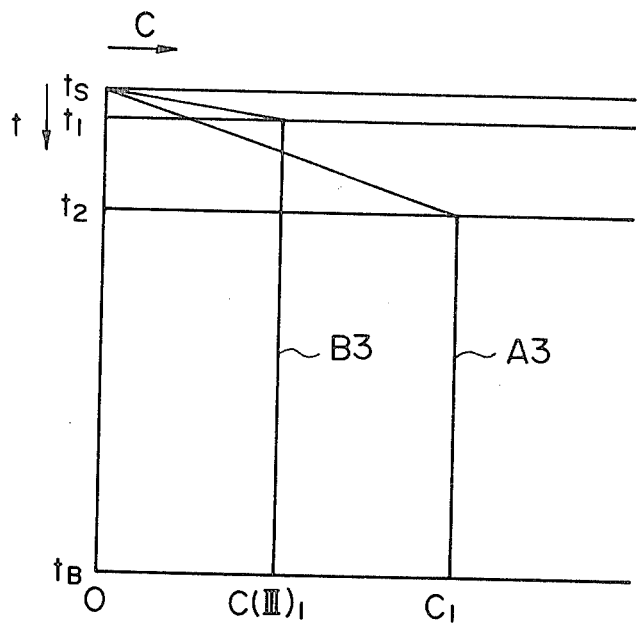

The embodiment shown in FIG. 3 is basically similar to that shown in FIG. 2, but differs in the following point. That is, in the embodiment shown in FIG. 2, both of the distribution concentrations of the atoms (M) and of the group III atoms commence to be decreased at the position $t_1$ until they become substantially zero at the position $t_S$. In contrast, in case of the embodiment in FIG. 3, the distribution concentration of the atoms (M) begins to be decreased at the position $t_2$, as shown by the solid line A3, while the distribution concentration of the group III atoms at the position $t_1$, as shown by the solid line B3, respectively, both becoming substantially zero at the position $t_S$.

That is, the first layer region ($t_S$ $t_B$) containing the atoms (M) is constituted of a layer region ($t_2$ $t_B$) in which they are contained substantially uniformly at a distribution concentration of $C_1$ and a layer region ($t_S$ $t_2$) in which the distribution concentration is decreased linearly from $C_1$ to substantially zero.

The second layer region ($t_S$ $t_B$) containing the group III atoms is constituted of a layer region ($t_1$ $t_B$) in which they are contained substantially uniformly at a distribution concentration of $C_{(III)1}$ and a layer region ($t_S$ $t_1$) in which the distribution concentration is decreased linearly from $C_{(III)1}$ to substantially zero.

Figure 4:
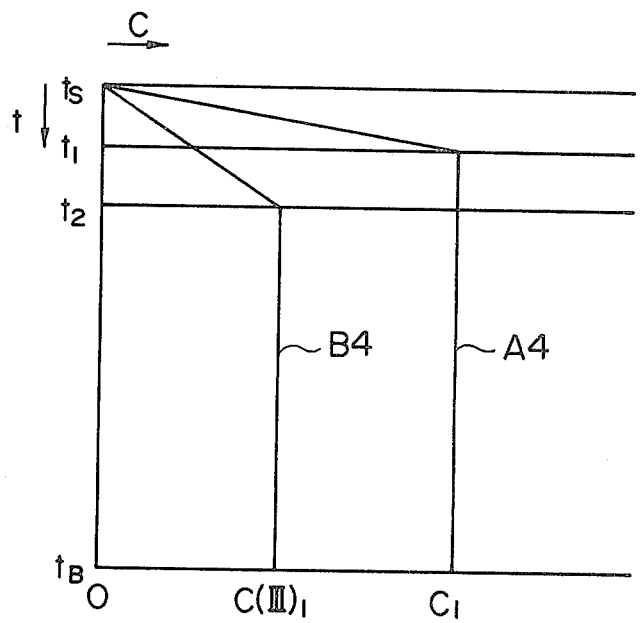

The embodiment shown in FIG. 4 is a modification of the embodiment shown in FIG. 3, having the same constitution as in FIG. 3 except that there is provided a layer region ($t_2$ $t_B$) where the group III atoms are contained in a uniform distribution at a distribution concentration of $C_{(III)1}$ within a layer region ($t_1$ $t_B$) where the atoms (M) are distributed uniformly at a distribution concentration of $C_1$.

Figure 5:
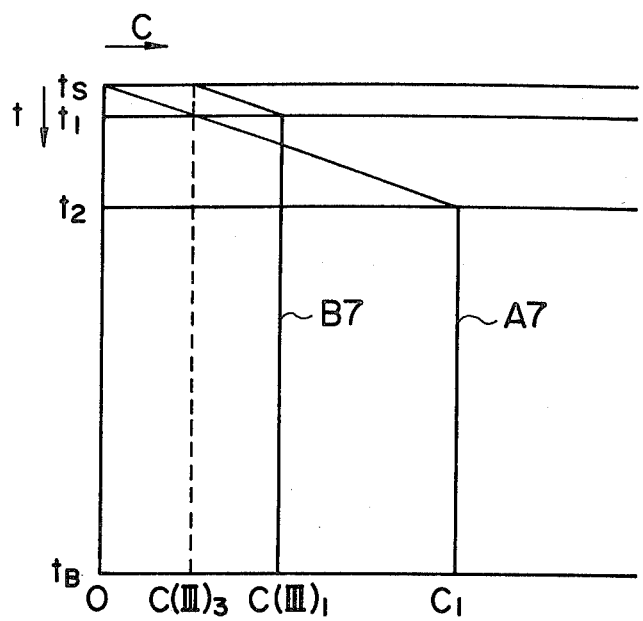

FIG. 5 shows an embodiment wherein the group III atoms are contained in the whole region of the amorphous layer [layer region ($t_S$ $t_B$)], and the group III atoms are contained at a distribution concentration of $C_{(III)3}$ even at the surface position $t_S$.

The layer region ($t_S$ $t_B$) containing the atoms (M), as shown by the solid line A7, has a layer region ($t_2$ $t_B$) in which they are contained substantially uniformly at a distribution concentration of $C_1$ and a layer region ($t_S$ $t_2$) in which the distribution concentration is decreased gradually from $C_1$ to substantially zero.

The distribution of the group III atoms in the amorphous layer is shown by the solid line B7. That is, the layer region ($t_S$ $t_B$) containing the group III atoms has a layer region ($t_1$ $t_B$) in which they are contained substantially uniformly at a distribution concentration of $C_{(III)1}$ and, in order to make the distribution change of the group III atoms between the distribution concentration $C_{(III)1}$ and the distribution concentration $C_{(III)3}$ continuous, a layer region ($t_S$ $t_1$) in which the group III atoms are contained in a distribution which is changed linearly continuously between these distribution concentrations.

Figure 6:
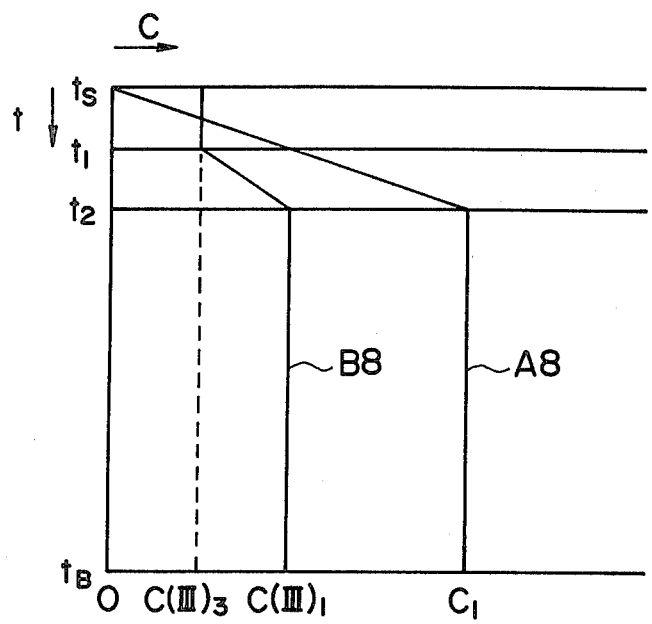

FIG. 6 shows a modification of the embodiment shown in FIG. 5.

Throughout the whole region of the amorphous layer, the atoms (M) and the group III atoms are contained, as shown by the solid line A8 and the solid line B8, respectively. In the layer region ($t_2$ $t_B$), the atoms (M) are contained at a distribution concentration of $C_1$ and the group III atoms at a distribution concentration of $C_{(III)1}$, respectively in uniform distributions, while in the layer region $(t_s t_1)$ the group III atoms are uniformly contained at a distribution concentration of $C_{(III)3}$.

The atoms (M) are contained, as shown by the solid line A8, in the layer region $(t_s t_2)$ in a distribution gradually decreased linearly from the distribution concentration $C_1$ at the support side to substantially zero at the position $t_s$.

In the layer region $(t_1 t_2)$, the group III atoms are contained in a distribution gradually decreased from the distribution concentration of $C_{(III)1}$ to the distribution concentration $C_{(III)3}$.

Figure 7:
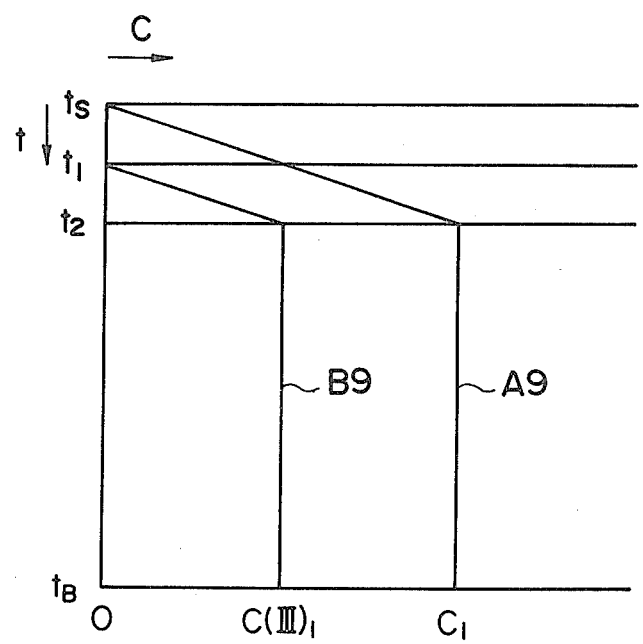

In the embodiment as shown in FIG. 7, both of the atoms (M) and the group III atoms are contained in ununiform distributions in the layer region continuously distributed, and there is provided a layer region $(t_1 t_B)$ containing the group III atoms within the layer region $(t_s t_B)$ containing the atoms (M).

And, in the layer region $(t_2 t_B)$, the atoms (M) are contained substantially uniformly at a constant distribution concentration of $C_1$ and the group III atoms at a constant distribution concentration of $C_{(III)1}$, respectively, and in the layer region $(t_1 t_2)$, the atoms (M) and the group III atoms are contained gradually decreased in distribution concentrations as the growth of respective layers, the distribution concentration being substantially zero at the position $t_1$ in case of the group III atoms.

The atoms (M) are contained so as to form a linearly decreased distribution in the layer containing no atom of the group III in the layer region $(t_s t_1)$, and the distribution concentration is made substantially zero at $t_s$.

Having described about some typical embodiments of the distributions of oxygen atoms, nitrogen atoms and carbon atoms and the group III atoms in the layer thickness direction contained in the amorphous layer by referring to FIGS. 2 to 7, it is also possible in case of FIGS. 3 through 7 to provide a layer region with a distribution having a portion with higher concentration C of the atoms (M) or the group III atoms on the support side and a portion relatively lowered in the concentrations C as compared with the support side on the surface $t_s$ side, similarly as described in case of FIG. 2.

In the present invention, when the amorphous layer is constituted of a-Si (H,X), typical examples of halogen atoms (X) to be incorporated in the amorphous layer are fluorine, chlorine, bromine and iodine, especially preferably fluorine and chlorine.

In the present invention, formation of an amorphous layer constituted of a-Si (H, X) may be conducted according to the vacuum deposition method utilizing discharging phenomenon, such as glow discharge method, sputtering method, ion-plating method, and the like. For example, for formation of an amorphous layer constituted of a-Si (H, X) according to the glow discharge method, a starting gas for introduction of hydrogen atoms (H) and/or halogen atoms (X) is introduced together with a starting gas for supplying silicon stoms (Si) into the deposition chamber which can be internally brought to reduced pressure, wherein glow discharge is generated thereby to form a layer of a-Si (H, X) on the surface of a support placed at a predetermined position in the chamber. When it is to be formed according to the sputtering method, a starting gas for introduction of hydrogen atoms (H) and/or halogen atoms (X) may be introduced into the chamber for sputtering, when effecting sputtering with the target formed of silicon (Si) in an atmosphere of an inert gas such as Ar, He, and the like, or a gas mixture based on these gases.

The starting gas for supplying Si to be used in the present invention may include gaseous or gasifiable hydrogenated silicons(silanes) such as $SiH_4$, $Si_2H_6$, $Si_3H_8$, $Si_4H_{10}$ and others as effective materials. In particular, $SiH_4$ and $Si_2H_6$ are preferred with respect to easy handling during layer formation and efficiency for supplying Si.

As the effective starting gas for incorporation of halogen atoms to be used in the present invention, there may be mentioned preferably a number of halogen compounds such as halogen gases, halides, interhalogen compounds, silane derivatives substituted with halogens, and the like which are gaseous or gasifiable.

Alternatively, it is also effective in the present invention to use a gaseous or gasifiable silicon compound containing halogen atoms which is constituted of both silicon atoms and halogen atoms.

Typical examples of halogen compounds preferably used in the present invention may include halogen gases such as fluorine, chlorine, bromine or iodine and interhalogen compounds such as $BrF$, $ClF$, $ClF_3$, $BrF_5$, $BrF_3$, $IF_3$, $IF_7$, $ICl$, $IBr$, etc.

As the silicon compound containing halogen atom, which is so called silane derivative substituted with halogen atoms, silicon halides such as $SiF_4$, $Si_2F_6$, $SiCl_4$, $SiBr_4$, or the like are preferred.

When the specific photoconductive member of this invention is formed according to the glow discharge method by use of such a silicon compound containing halogen atoms, it is possible to form an amorphous layer constituted of a-Si containing halogen atoms (X) on a given support without use of a hydrogenated silicon gas as the starting gas capable of supplying Si.

In forming the amorphous layer containing halogen atoms according to the glow discharge method, the basic procedure comprises feeding a starting gas for supplying Si, namely a gas of silicon halide and a gas such as Ar, $H_2$, He, etc. at a predetermined ratio in a suitable amount into the deposition chamber for formation of an amorphous layer, followed by excitation of glow discharge to form a plasma atmosphere of these gases, thereby forming an amorphous layer on a support. It is also possible to form a layer by mixing a gas of a silicon compound containing hydrogen atoms at a suitable ratio with these gases in order to incorporate hydrogen atoms therein.

Each of the gases for introduction of respective atoms may be either a single species or a mixture of plural species at a predetermined ratio.

For formation of an amorphous layer of a-Si (H, X) by the reactive sputtering method or the ion-plating method, for example, the sputtering is effected by using a target of Si in a suitable gas plasma atmosphere in case of the sputtering method. Alternatively, in case of ion-plating method, a polycrystalline or single crystalline silicon is placed as vaporization source in a vapor deposition boat, and the silicon vaporization source is vaporized by heating by resistance heating method, electron beam method (EB method), and the like thereby to permit vaporized flying substances to pass through a suitable gas plasma atmosphere.

During these procedures, in either of the sputtering method or the ion-plating method, for introduction of halogen atoms into the layer formed, a gas of a halogen compound as mentioned above or a silicon compound containing halogen as mentioned above may be introduced into the deposition chamber to form a plasma atmosphere of said gas therein.

When hydrogen atoms are introduced, a starting gas for introduction of hydrogen atoms such as $H_2$ and a gas such as silanes as mentioned above may be introduced into the deposition chamber for sputtering, followed by formation of a plasma atmosphere of said gases.

In the present invention, as the starting gas for introduction of halogen atoms, the halogen compounds or silicon compounds containing halogens as mentioned above can effectively be used. In addition, it is also possible to use a gaseous or gasifiable halide containing hydrogen atom as one of the constituents such as hydrogen halide, including HF, HCl, HBr, HI and the like or halo-substituted hydrogenated silicon, including $SiH_2F_2$, $SiH_2I_2$, $SiH_2Cl_2$, $SiHCl_3$, $SiH_2Br_2$, $SiHBr_3$ and the like as an effective starting material for formation of an amorphous layer.

These halides containing hydrogen atom, which can introduce hydrogen atoms very effective for controlling electrical or photoelectrical characteristics into the layer during formation of the amorphous layer simultaneously with introduction of halogen atoms, can preferably be used as the starting material for introduction of halogen atoms.

For incorporation of hydrogen atoms structurally into the amorphous layer, $H_2$ or a gas of hydrogenated silicon, including $SiH_4$, $Si_2H_6$, $Si_3H_8$, $Si_4H_{10}$ and so on may be permitted to be co-present with a silicon compound for supplying Si in a deposition chamber, wherein discharging is excited.

For example, in case of the reactive sputtering method, an Si target is used and a gas for introduction of halogen atoms and $H_2$ gas are introduced together with, if necessary, an inert gas such as He, Ar, etc. into a deposition chamber, wherein a plasma atmosphere is formed to effect sputtering by using said Si target, thereby forming an amorphous layer of a-Si(H, X) on the substrate.

Further, there may also be introduced a gas such as $B_2H_6$ or others as doping agent.

The amount of hydrogen atoms (H), halogen atoms (X), or total amount of both of these atoms incorporated in the amorphous layer in the photoconductive member according to the present invention may be preferably 1 to 40 atomic %, more preferably 5 to 30 atomic %.

For controlling the amounts of hydrogen atoms (H) and/or halogen atoms (X) in the amorphous layer, the deposition support temperature and/or the amounts of the starting materials for incorporation of hydrogen atoms(H) or halogen atoms(X) to be introduced into the deposition device system, the discharging power, and the like may be controlled.

In the present invention, as a diluting gas for use in formation of an amorphous layer according to the glow discharge method or the sputtering method, there may be included preferably so called rare gases such as He, Ne, Ar, etc.

For formation of a first layer region (O, N, C) by introduction of at least one of members (M) selected from the group consisting of oxygen atoms, nitrogen atoms and carbon atoms into an amorphous layer or a second layer region (III) by introduction of the atoms of an element belonging to the group III of the periodic table into the amorphous layer, a starting material for introduction of the atoms of the group III or for introduction of the atoms (M) or both starting materials may be used together with a starting material for formation of an amorpohous layer, while controlling their amounts to be incorporated in the layer formed.

When the glow discharge method is used for formation of a first layer region (O, N, C) constituting the amorphous layer, the starting material for formation of the first layer region may be selected as desired from those for formation of the amorphous layer as described above and at least one of the starting materials for introducing the atoms (M) are added thereto. As the starting material for introduction of the atoms (M), there may be employed most of gaseous substances or gasified gasifiable substances containing atoms (M) as constituent atoms.

For example, as the starting material for introduction of oxygen atoms as the atoms (M), there may be employed a mixture of a starting gas having silicon atoms (Si) as constituent atoms, a starting gas having oxygen atoms (O) as constituent atoms and, if necessary, a gas having hydrogen atoms (H) and/or halogen atoms (X) as constituent atoms at a desired mixing ratio. Alternatively, a mixture of a starting gas having silicon atoms (Si) as constituent atoms and a starting gas having oxygen atoms (O) and hydrogen atoms (H) as constitutent atoms at a desired mixing ratio can also be used. Further, it is also possible to use a mixture of a starting gas having silicon atoms (Si) as constituent atoms and a starting gas having the three atoms of silicon atoms (Si), oxygen atoms (O) and hydrogen atoms (H) as constituent atoms.

As another method, it is also possible to use a mixture of a starting gas having silicon atoms (Si) and hydrogen atoms (H) as constituent atoms and a starting gas having oxygen atoms (O) as constituent atoms.

As the starting material for introduction of nitrogen atoms as the atoms (M), there may be employed a mixture of a starting gas having silicon atoms (Si) as constituent atoms, a starting gas having nitrogen atoms (N) as constituent atoms and, if necessary, a gas having hydrogen atoms (H) and/or halogen atoms (X) as constituent atoms at a desired mixing ratio. Alternatively, a mixture of a starting gas having silicon atoms (Si) as constituent atoms and a starting gas having nitrogen atoms (N) and hydrogen atoms (H) as constituent atoms at a desired mixing ratio can also be used. Further, it is also possible to use a mixture of a starting gas having silicon atoms (Si) as constituent atoms and a starting gas having the three atoms of silicon atoms (Si), nitrogen atoms (N) and hydrogen atoms (H) as constituent atoms at a desired mixing ratio.

As another method, it is also possible to use a mixture of a starting gas having silicon atoms (Si) and hydrogen atoms (H) as constituent atoms and a starting gas having nitrogen atoms (N) as constitutent atoms.

As the starting material for introduction of carbon atoms as the atoms (M), there may be employed a mixture of a starting gas having silicon atoms (Si) as constituent atoms, a starting gas having carbon atoms (C) as constituent atoms and, if necessary, a gas having hydrogen atoms (H) and/or halogen atoms (X) as constituent atoms at a desired mixing ratio. Alternatively, a mixture of a starting gas having silicon atoms (Si) as constituent atoms and a starting gas having carbon atoms (C) and hydrogen atoms (H) as constituent atoms at a desired mixing ratio can also be used. Further, it is also possible to use a mixture of a starting gas having silicon atoms (Si) as constituent atoms and a starting gas having the three atoms of silicon atoms (Si), carbon atoms (C) and hydrogen atoms (H) as constituent atoms.

As another method, it is also possible to use a mixture of a starting gas having silicon atoms (Si) and hydrogen atoms (H) as constituent atoms and a starting gas having carbon atoms (C) as constituent atoms.

As the starting materials for introduction of the atoms (M) to form the first layer region (O, N, C), there may be effectively used, for example, oxygen($O_2$), ozone-($O_3$), nitrogen monoxide(NO), nitrogen dioxide($NO_2$), dinitrogen oxide($N_2O$), dinitrogen trioxide($N_2O_3$), dinitrogen tetroxide($N_2O_4$), dinitrogen pentoxide($N_2O_5$), nitrogen trioxide($NO_3$), lower siloxanes containing silicon atoms (Si), oxygen atoms (O) and hydrogen atoms (H) as constituent atoms such as disiloxane($H_3SiOSiH_3$), trisiloxane($H_3SiOSiH_2OSiH_3$), and the like; gaseous or gasifiable nitrogen compounds constituted of nitrogen atoms (N) or nitrogen atoms (N) and hydrogen atoms (H) such as nitrogen, nitrides and azides, including for example nitrogen($N_2$), ammonia($NH_3$), hydrazine($H_2NNH_2$), hydrogen azide($HN_3$), ammonium azide($NH_4N_3$) and the like; saturated hydrocarbons having 1 to 5 carbon atoms such as methane($CH_4$), ethane($C_2H_6$), propane($C_3H_8$), n-butane(n-$C_4H_{10}$), pentane($C_5H_{12}$) and the like; ethylenic hydrocarbons having 2 to 4 carbon atoms such as ethylene($C_2H_4$), propylene($C_3H_6$), butene-1($C_4H_8$), butene-2($C_4H_8$), isobutylene($C_4H_8$), pentene($C_5H_{10}$) and the like; and acetylenic hydrocarbons having 2 to 4 carbon atoms such as acetylene($C_2H_2$), methylacetylene ($C_3H_4$), butyne($C_4H_6$) and the like; alkyl silanes containing silicon atoms (Si), carbon atoms (C) and hydrogen atoms (H) as constituent atoms such as $Si(CH_3)_4$, $Si(C_2H_5)_4$, and the like.

Otherwise, for the advantage of introducing halogen atoms in addition to nitrogen atoms, there may also be employed halo-containing nitrogen compounds such as nitrogen trifluoride ($F_3N$), nitrogen tetrafluoride ($F_2N_2$), and the like.

Not only one kind of these starting materials for introduction of the atoms (M) for formation of the first layer region (O, N, C) may be used, but also plural kinds suitably selected may be used. It is also possible to introduce two or more kinds of oxygen atoms, nitrogen atoms and carbon atoms into the first layer region (O, N, C) by use of at least one kind selected from the starting materials for introduction of oxygen atoms, the starting materials for introduction of nitrogen atoms and the starting materials for introduction of carbon atoms.

For formation of a layer region (O) containing oxygen atoms, as the first layer region (O, N, C), according to the sputtering method, a single crystalline or polycrystalline Si wafer or $SiO_2$ wafer or a wafer containing Si and $SiO_2$ mixed therein may be used as a target and sputtering may be effected in various gas atmospheres.

For example, when Si wafer is used as a target, a starting material for introduction oxygen optionally together with a starting material for incorporation of hydrogen atoms (H) and/or halogen atoms (X), which may be diluted with a diluting gas if desired, is introduced into a deposition chamber for sputter, in which gas plasma of these gases is formed and sputtering is effected on the aforesaid Si wafer.

Alternatively, with the use of Si and $SiO_2$ as separate targets or with the use of a target of one sheet of a mixture of Si and $SiO_2$, sputtering may be effected in atmosphere of a diluted gas as a gas for sputter or in atmosphere of a gas containing hydrogen atoms (H) and/or halogen atoms (X) as constituent atoms. As the starting material for introduction of oxygen atoms, there may be employed those for introduction of oxygen atoms among the starting materials, as shown in examples for use in the glow discharge, as effective gases also in case of sputtering.

For formation of a layer region (N) containing nitrogen atoms, as the first layer region (O, N, C), by the sputtering method, a single crystalline or polycrystalline Si wafer or $Si_3N_4$ or a wafer containing Si and $Si_3N_4$ mixed therein is used as a target and sputtering is effected in an atomsphere of various gases.

For example, when Si wafer is used as a target, a starging material for introduction of nitrogen atoms (N) and, if necessary, a starting material for introduction of hydrogen atoms (H) and/or halogen atoms (X), which may be diluted with a diluting gas, if desired, is introduced into a deposition chamber for sputter to form a gas plasma of these gases therein and effect sputtering on said Si wafer.

Alternatively, Si and $Si_3N_4$ as separate targets or one sheet target of a mixture of Si and $Si_3N_4$ can be used and sputtering is effected in a diluted gas atmosphere as a gas for sputter or a gas atmosphere containing hydrogen atoms (H) and/or halogen atoms (X) as constituting atoms. As the starting material for introduction of nitrogen atoms, there may be employed those for introduction of nitrogen atoms among the starting materials, as shown in examples for use in glow discharge, as effective gases also in case of sputtering.

For formation of a layer region (C) containing carbon atoms, as the first layer region (O, N, C), by the sputtering method, a single crystalline or polycrystalline Si wafer or C wafer or a wafer containing Si and C mixed therein is used as a target and sputtering is effected in an atmosphere of various gases.

For example, when Si wafer is used as a target, a starting material for introduction of carbon atoms (C) and, if necessary, a starting material for introduction of hydrogen atoms (H) and/or halogen atoms (X), which may be diluted with a diluting gas, if desired, is introduced into a deposition chamber for sputter to form a gas plasma of these gases therein and effect sputtering on said Si wafer.

Alternatively, Si and C as separate targets or one sheet target of a mixture of Si and C can be used and sputtering is effected in a gas atmosphere containing at least hydrogen atoms (H) and/or halogen atoms (X) as constituent atoms. As the starting gas for introduction of carbon atoms, there may be employed those for introduction of carbon atoms among the starting materials, as exemplified for use in glow discharge, as effective gases also in case of sputtering.

For introduction of two or more kinds of oxygen atoms (O), nitrogen atoms (N) and carbon atoms (C) into the first layer region (O, N, C) formed in forming the first layer region (O, N, C) according to the sputtering method, either one or a mixture of $SiO_2$ and $Si_3N_4$ may be used as the target, a mixture of Si with $SiO_2$ or $Si_3N_4$ or a mixture of Si, $SiO_2$ and $Si_3N_4$ may be used as the target, or alternatively a mixture of C with $SiO_2$ or $Si_3N_4$ or a mixture of C, $SiO_2$ and $Si_3N_4$ may be used as the target.

For formation of a second layer region (III) constituting the amorphous layer, a gaseous or a gasifiable starting material for introduction of the atoms of the group III may be introduced under gaseous state together with a starting material for formation of an amorphous layer as mentioned above into a vacuum deposition chamber for forming an amorphous layer.

The content of the atoms of the group III to be introduced into the second layer region can be freely controlled by controlling the gas flow amounts and the gas flow amount ratios of the starting materials introduced into the deposition chamber, discharging power, and the like.

As the starting materials, which can be effectively used in the presesent invention for introduction of the group III atoms, there may be included for introduction of boron atoms boron hydrides such as $B_2H_6$, $B_4H_{10}$, $B_5H_9$, $B_5H_{11}$, $B_6H_{10}$, $B_6H_{12}$, $B_6H_{14}$, etc., and boron halides such as $BF_3$, $BCl_3$, $BBr_3$, etc. In addition, there may also be employed $AlCl_3$, $GaCl_3$, $Ga(CH_3)_3$, $InCl_3$, $TlCl_3$ and others.

In the present invention, formation of a transition layer region (layer region wherein either of the atoms (M) or the group (III) atoms are changed in distribution concentration in the layer thickness direction) can be achieved by changing suitably the flow rate of the gas containing the component to be changed in distribution concentration. For example, by the manual method or the method using an externally driven motor conventionally used, the opening of a predetermined needle valve provided in the course of the gas flow system may be gradually changed. During this operation, the rate at which the flow rate is changed is not required to be linear, but the flow rate can be changed according to a change rate curve previously designed by, for example, a microcomputer, to obtain a desirable content curve.

During formation of an amorphous layer, whether the plasma state may be either maintained or intermitted at the boundary between the transition layer region and other layer regions, no influence is given on the characteristic of the layer formed, but it is preferred to perform the operation continuously from the standpoint of process control.

When the transition layer region is formed according to the sputtering method, for using a target containing a component to be changed in distribution concentration, the target may be prepared previously so that said component may be distributed at a desired distribution concentration change.

The amorphous layer may have a thickness suitably determined as desired so that the photocarriers generated in the amorphous layer may be transported efficiently, but it is generally 3 to 100μ, preferably 5 to 50μ.

The support may be either electroconductive or insulating. As the electroconductive material, there may be mentioned metals such as NiCr, stainless steel, Al, Cr, Mo, Au, Nb, Ta, V, Ti, Pt, Pd, etc. or alloys thereof.

As insulating supports, there may conventionally be used films or sheets of synthetic resins, including polyesters, polyethylene, polycarbonates, cellulose acetate, polypropylene, polyvinyl chloride, polyvinylidene chloride, polystyrene, polyamides, etc., glasses, ceramics, papers and the like. These insulating supports may suitably have at least one surface subjected to electroconductive treatment, and it is desirable to provide other layers on the side to which said electroconductive treatment has been applied.

For example, electroconductive treatment of a glass can be effected by providing a thin film of NiCr, Al, Cr, Mo, Au, Ir, Nb, Ta, V, Ti, Pt, Pd, $In_2O_3$, $SnO_2$, ITO($In_2O_3+SnO_2$), and the like thereon. Alternatively, a synthetic resin film such as polyester film can be subjected to the electroconductive treatment on its surface by vacuum vapor deposition, electron-beam deposition, sputtering, or the like of a metal such as NiCr, Al, Ag, Pb, Zn, Ni, Au, Cr, Mo, Ir, Nb, Ta, V, Ti, Pt, etc. or by laminating treatment with said metal, thereby imparting electroconductivity to the surface. The support may be shaped in any form such as cylinders, belts, plates or others, and its form may be determined as desired. For example, when the photoconductive member 100 in FIG. 1 is used as an image forming member for electrophotography, it may desirably be formed into an endless belt or a cylinder for use in continuous high speed copying. The support may have a thickness, which is conveniently determined so that a photoconductive member as desired may be formed. When the photoconductive member is required to have a flexibility, the support is made as thin as possible, so far as the function of a support can be exhibited. However, in such a case, the thickness is generally 10μ or more from the points of fabrication and handling of the support, and its mechanical strength.

In the present invention, it is preferred to provide on the amorphous layer a surface layer of so called barrier layer having a function to impede injection of charges from the free surface side into said amorphous layer. The surface layer provided on the amorphous layer is constituted of an amorphous material containing at least one kind of atoms selected from the group consisting of carbon atoms (C) and nitrogen atoms (N), optionally together with at least one of hydrogen atom (H) and halogen atom (X), in a matrix of silicon atoms (these are referred to comprehensively as a-$[Si_x(C,N)_{1-x}](H,X)_{1-y}$ (where $0<x<1$, $0<y<1$), an electrically insulating metal oxide or an electrically insulating organic compound.

In the present invention, the halogen atom (X) to be contained in the surface layer may preferably be F, Cl, Br or I, especially F or Cl.

Typical examples of the amorphous materials as mentioned above effectively used for constituting the above surface layer may include, for example, carbon type amorphous materials such as a-$Si_aC_{1-a}$, a-$(Si_bC_{1-b})_cH_{1-c}$, a-$(Si_dC_{1-d})_eX_{1-e}$, a-$(Si_fC_{1-f})_g(H+X)_{1-g}$; nitrogen type amorphous materials such as a-$Si_hN_{1-h}$, a-$(Si_iN_{1-i})_jH_{1-j}$, a-$(Si_kN_{1-k})_lX_{1-l}$, a-$(Si_mN_{1-m})_n(H+X)_{1-n}$; etc. Further, there may also be mentioned amorphous materials containing at least two kinds of atoms of carbon (C) and nitrogen (N) as constituent atoms in the amorphous materials as set forth above (where $0<a, b, c, d, e, f, g, h, i, j, k, l, m, n<1$).

These amorphous materials may suitably be selected depending on the properties required for the surface layer by optimum design of the layer strucure, easiness in consecutive fabrication of the amorphous layer to be provided in contact with said surface layer, and the like. In particular, from the standpoint of properties, carbon type amorphous materials may preferably be selected.

As the method for layer formation when the surface layer is constituted of the amorphous layer as described above, there may be mentioned the glow discharge method, the sputtering method, the ion implantation method, the ion plating method, the electron-beam method or the like.

When the surface layer is constituted of the amorphous material as described above, it is formed carefully so that the characteristics required may be given exactly as desired.

That is, a substance constituted of silicon atoms (Si) and at least one of carbon atoms (C) and nitrogen atoms (N), and optionally hydrogen atoms (H) and/or halogen atoms (X) can take structurally various forms from crystalline to amorphous and electrical properties from conductive through semi-conductive to insulating and the properties from photoconductive to non-photoconductive depending on the preparation conditions. Therefore, in the present invention, the preparation conditions are severely selected so that there may be formed amorphous materials which are non-photoconductive and high in dark resistance at least with respect to the light in visible region.

The contents of carbon atoms (C), nitrogen atoms (N), hydrogen atoms (H) and halogen atoms (X) in the surface layer are important factors, similarly to the conditions for preparation of the surface layer for forming the upper layer provided with desired characteristics.

In forming the surface layer constituted of a-$Si_aC_{1-a}$, the content of carbon atoms may generally 60 to 90 atomic %, preferably 65 to 80 atomic %, most preferably 70 to 75 atomic %, namely interms of representation by the index a, 0.1 to 0.4, preferably 0.2 to 0.35, most preferably 0.25 to 0.3. In case of the constitution of a-$(Si_bC_{1-b})_cH_{1-c}$, the content of carbon atoms is generally 30 to 90 atomic %, preferably 40 to 90 atomic %, most preferably 50 to 80 atomic %, and the content of hydrogen atoms generally 1 to 40 atomic %, preferably 2 to 35 atomic %, most preferably 5 to 30 atomic %, namely in terms of representation by the indexes b and c, b being generally 0.1 to 0.5, preferably 0.1 to 0.35, most preferably 0.15 to 0.3, and c being generally 0.60 to 0.99, preferably 0.65 to 0.98, most preferably 0.7 to 0.95. In case of the constitution of a-$(Si_dC_{1-d})_eX_{1-e}$ or a-$(Si_fC_{1-f})_g(H+X)_{1-g}$, the content of carbon atoms is generally 40 to 90 atomic %, preferably 50 to 90 atomic %, most preferably 60 to 80 atomic %, the content of halogen atoms or the sum of the contents of halogen atoms and hydrogen atoms generally 1 to 20 atomic %, preferably 1 to 18 atomic %, most preferably 2 to 15 atomic %, and the content of hydrogen atoms, when both halogen atoms and hydrogen atoms are contained, is generally 19 atomic % or less, preferably 13 atomic % or less, namely in terms of representation by d, e, f, and g, d and f are generally 0.1 to 0.47, preferably 0.1 to 0.35, most preferably 0.15 to 0.3, e and g 0.8 to 0.99, preferably 0.82 to 0.99, most preferably 0.85 to 0.98.

When the surface layer is constituted of a nitrogen type amorphous material, the content of nitrogen atoms in case of a-$Si_hN_{1-h}$ is generally 43 to 60 atomic %, preferably 43 to 50 atomic %, namely in terms of representation by h, generally 0.4 to 0.57, preferably 0.5 to 0.57.

In case of the constitution of a-$(Si_iN_{1-i})_jH_{1-j}$, the content of nitrogen atoms is generally 25 to 55 atomic %, preferably 35 to 55 atomic %, and the content of hydrogen atoms generally 2 to 35 atomic %, preferably 5 to 30 atomic %, namely in terms of representation by i and j, i being generally 0.43 to 0.6, preferably 0.43 to 0.5 and j generally 0.65 to 0.98, preferably 0.7 to 0.95. In case of the constitution of a-$(Si_kN_{1-k})_lX_{1-l}$ or a-$(Si_mN_{1-m})_n(H+X)_{1-n}$, the content of nitrogen atoms is generally 30 to 60 atomic %, preferably 40 to 60 atomic %, the content of halogen atoms or the sum of contents of halogen atoms and hydrogen atoms generally 1 to 20 atomic %, preferably 2 to 15 atomic %, and the content of hydrogen atoms, when both halogen atoms and hydrogen atoms are contained, generally 19 atomic % or less, preferably 13 atomic % or less, namely in terms of representation by k, l, m and n, k and m being generally 0.43 to 0.60, preferably 0.43 to 0.49, and l and n generally 0.8 to 0.99, preferably 0.85 to 0.98.

As the electrically insulating metal oxides for constituting the surface layer, there may preferably be mentioned $TiO_2$, $Ce_2O_3$, $ZrO_2$, $HfO_2$, $GeO_2$, $CaO$, $BeO$, $Y_2O_3$, $Cr_2O_3$, $Al_2O_3$, $MgO.Al_2O_3$, $SiO_2.MgO$, etc. A mixture of two or more kinds of these compounds may also be used to form the surface layer.

The surface layer constituted of an electrically insulating metal oxide may be formed by the vacuum deposition method, the CVD (chemical vapor deposition) method, the glow discharge decomposition method, the sputtering method, the ion implantation method, the ion plating method, the electron-beam method or the like.

The numerical range of the layer thickness of the surface layer is an important factor to achieve effectively the above-mentioned purposes. If the layer thickness is too thin, the function of barring penetration of charges from the side of the surface of the surface layer into the amorphous layer cannot sufficiently be fulfilled. On the other hand, if the thickness is too thick, the probability of combination of the photo-carriers generated in the amorphous layer by irradiation of light with the charges existing on the surface of the surface layer will become very small. Thus, in either of the cases, the objects by provision of a surface layer cannot effectively be achieved.

In view of the above points, a thickness of the surface layer for effective achievement of the object by provision of a surface layer is generally in the range of from 30 Å to 5µ, preferably from 50 Å to 1µ.

The photoconductive member of the present invention designed to have layer constitution as described above can overcome all of the problems as mentioned above and exhibits very excellent electrical, optical, photoconductive charcteristics, and good environmental characteristics in use.

In particular, when it is used as an image forming member for electrophotography, it is excellent in charge retentivity in charging treatment without any influence of residual potential on image formation at all, being stable in its electrical properties with high sensitivity and having high SN ratio as well as excellent light fatigue resistance and repeated usage characteristics, whereby it is possible to obtain repeatedly images of high quality with high concentration, clear halftone and high resolution.

Next, the process for producing the photoconductive member formed according to the glow discharge decomposition method will be described below.

Figure 8:
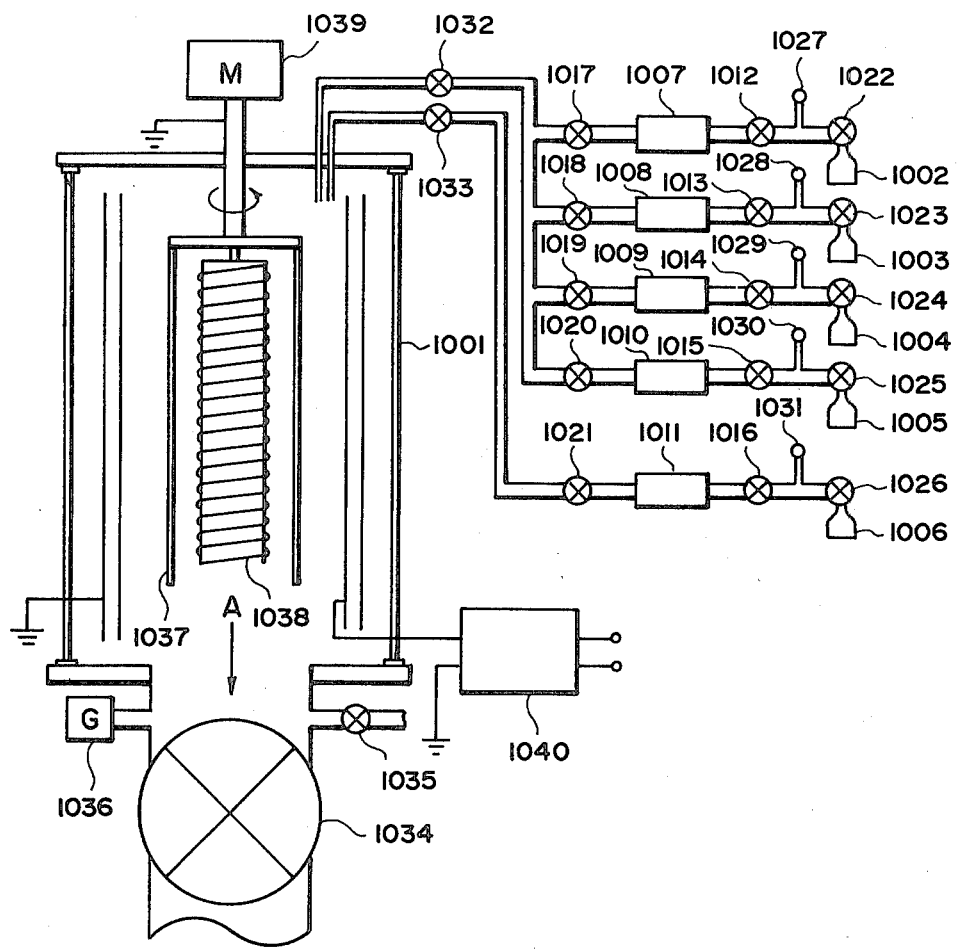
FIG. 8 a schematic flow chart for illustration of a device used for preparation of the photoconductive members of the present invention.

FIG. 8 shows a device for producing a photoconductive member according to the glow discharge decomposition method.

In the gas bombs 1002, 1003, 1004, 1005, and 1006 shown in FIG. 8, there are hermetically contained starting gases for formation of respective layers of the present invention. For example, 1002 is a bomb containing $SiH_4$ gas (purity: 99.999%) diluted with He (hereinafter abbreviated as $SiH_4$/He), 1003 is a bomb containing $B_2H_6$ gas (purity: 99.999%) diluted with He (hereinafter abbreviated as $B_2H_6$/He), 1004 is a bomb containing $CH_4$ gas (purity: 99.999%), 1005 is a bomb containing NO gas (purity: 99.999%), and 1006 is a bomb containing $SiF_4$ gas (purity: 99.999%) diluted with He (hereinafter abbreviated as $SiF_4$/He).

For allowing these gases to flow into the reaction chamber 1001, on confirmation of the valves 1022-1026 of the gas bombs 1002-1006 and the leak valve 1035 to be closed, and the inflow valves 1012-1016, the outflow valves 1017-1021 and the auxiliary valves 1032 and 1033 to be opened, the main valve 1034 is first opened to evacuate the reaction chamber 1001 and the gas pipelines. As the next step, when the reading on the vacuum indicator 1036 becomes $5 \times 10^{-6}$ Torr, the auxiliary valves 1032 and 1033 and the outflow valves 1017-1021 are closed.

Referring now to an example of forming an amorhpous layer on a substrate cylinder 1037, $SiH_4$/He gas from the gas bomb 1002, $B_2H_6$/He gas from the gas bomb 1003 and NO gas from the gas bomb 1005 are permitted to flow into the mass-flow controllers 1007, 1008 and 1010 by opening the valves 1022, 1023 and 1025 to control the pressures at the outlet pressure gauges 1027, 1028 and 1030 to 1 Kg/cm$^2$ and opening gradually the inflow valves 1012, 1013 and 1015. Subsequently, the outflow valves 1017, 1018, and 1020 and the auxiliary valve 1032 are gradually opened to permit respective gases to flow into the reaction chamber 1001. The outflow valves 1017, 1018 and 1020 are controlled so that the relative flow rate ratios between $SiH_4$/He, $B_2H_6$/He and NO gases may have desired values and opening of the main valve 1034 is also controlled while watching the reading on the vacuum indicator 1036 so that the pressure in the reaction chamber may reach a desired value. And, after it is confirmed that the temperature of the substrate cylinder 1037 is set at 50°–400° C. by the heater 1038, the power source 1040 is set at a desired power to excite glow discharge in the reaction chamber 1001, while simultaneously performing the operation to change gradually the flow rates of $B_2H_6$/He gas and NO gas in accordance with a previously designed change ratio curve by changing the valves 1018 and 1020 gradually by the manual method or by means of an externally driven motor, thereby controlling the contents of the group III atoms such as B atoms and the like and oxygen atoms in the layer.

In the above procedure, when $NH_3$ gas or $CH_4$ gas is employed in place of NO gas, nitrogen atoms or carbon atoms may be incorporated in the layer formed similarly to oxygen atoms.

For further forming a surface layer on the amorphous layer, layer formation may be carried out by using $CH_4$ gas in place of $B_2H_6$/He gas and NO gas employed in formation of the amorphous layer.

All the outflow valves other than those for gases necessary for formation of respective layers are of course closed, and during formation of respective layers, in order to avoid remaining of the gas used in the precedent layer in the reaction chamber 1001 and pipelines from the outflow valves 1017-1021 to the reaction chamber 1001, there may be conducted the procedure, comprising once evacuating to a high vacuum the system by closing the outflow valves 1071-1021 and opening the auxiliary valves 1032 and 1033 with full opening of the main valve 1034, if necessary.

During formation of the layer, the substrate cylinder 1037 may be rotated at a constant speed by means of a motor 1039 in order to effect uniformly layer formation.

EXAMPLE 1

Image forming members for electrophotography were prepared by carrying out formation of amorphous layers having the layer constitution as shown in FIG. 2 on Al cylinders by means of the preparation device as shown in FIG. 8, with the contents of boron (B) and oxygen (O) in the layers being as parameters. The common preparation conditions are as shown in Table 1.

In Table 2, there are shown the results of evaluation for respective samples, with contents of boron $C_{(III)1}$ represented on the axis of ordinate and the contents of oxygen $C_1$ on the axis of abscissa, respectively.

The image forming members for electrophotography prepared were subjected to a series of electrophotographic process of charging-imagewise exposure-development-transfer, and overall evaluations of the results with respect to density, resolution, tone reproducibility, etc. were performed for the images visualized on transfer papers.

TABLE 1

| Amorphous layer constitution | Gases employed (vol %) | Flow rate (SCCM) | Layer formation rate (Å/S) | Layer thickness ($\mu$) | Discharging power (W/cm$^2$) | Substrate temperature (°C.) | Pressure during reaction (torr) | Discharging frequency (MHz) |
|---|---|---|---|---|---|---|---|---|
| Layer region ($t_1$ $t_B$) | SiH$_4$/He = 0.5<br>NO 100<br>B$_2$H$_6$/He = 3 × 10$^{-3}$ | SiH$_4$ = 200 suitably changed depending on samples | 16 | 20 | 0.2 | 250 | 0.5 | 13.56 |
| Layer region ($t_S$ $t_1$) | SiH$_4$/He = 0.5<br>NO 100<br>B$_2$H$_6$/He = 3 × 10$^{-3}$ | SiH$_4$ = 200 suitably changed continuously | 16 | 1 | 0.2 | 250 | 0.5 | 13.56 |

TABLE 2

| O distribution concentration $C_1$ (atomic %) | B distribution concentration $C_{(III)1}$ (atomic ppm) | | | | | | |
|---|---|---|---|---|---|---|---|
| | 0.1 Sample No./Evaluation | 0.5 Sample No./Evaluation | 1 Sample No./Evaluation | 5 Sample No./Evaluation | 10 Sample No./Evaluation | 30 Sample No./Evaluation | 50 Sample No./Evaluation |
| 0.01 | 1-1 Δ | 1-2 Δ | 1-3 Δ | 1-4 ○ | 1-5 ○ | 1-6 Δ | 1-7 Δ |
| 0.03 | 2-1 Δ | 2-2 Δ | 2-3 Δ | 2-4 ○ | 2-5 ○ | 2-6 Δ | 2-7 Δ |
| 0.05 | 3-1 Δ | 3-2 Δ | 3-3 Δ | 3-4 ○ | 3-5 ○ | 3-6 ○ | 3-7 Δ |
| 0.1 | 4-1 Δ | 4-2 Δ | 4-3 Δ | 4-4 ○ | 4-5 ○ | 4-6 ○ | 4-7 ○ |
| 0.3 | 5-1 Δ | 5-2 Δ | 5-3 Δ | 5-4 ○ | 5-5 ○ | 5-6 ○ | 5-7 ○ |
| 0.5 | 6-1 Δ | 6-2 Δ | 6-3 Δ | 6-4 ○ | 6-5 ◎ | 6-6 ◎ | 6-7 ◎ |
| 1 | 7-1 Δ | 7-2 Δ | 7-3 Δ | 7-4 ○ | 7-5 ◎ | 7-6 ◎ | 7-7 ◎ |
| 2 | 8-1 Δ | 8-2 Δ | 8-3 ○ | 8-4 ○ | 8-5 ◎ | 8-6 ◎ | 8-7 ◎ |
| 3.5 | 9-1 ○ | 9-2 ○ | 9-3 ○ | 9-4 ◎ | 9-5 ◎ | 9-6 ◎ | 9-7 ◎ |
| 5 | 10-1 ○ | 10-2 ○ | 10-3 ○ | 10-4 ○ | 10-5 ◎ | 10-6 ◎ | 10-7 ◎ |
| 7 | 11-1 Δ | 11-2 ○ | 11-3 ○ | 11-4 ○ | 11-5 ○ | 11-6 ◎ | 11-7 ◎ |
| 10 | 12-1 Δ | 12-2 Δ | 12-3 ○ | 12-4 ○ | 12-5 ○ | 12-6 ○ | 12-7 ○ |
| 20 | 13-1 Δ | 13-2 Δ | 13-3 Δ | 13-4 ○ | 13-5 ○ | 13-6 ○ | 13-7 ○ |
| 30 | 14-1 Δ | 14-2 Δ | 14-3 Δ | 14-4 Δ | 14-5 Δ | 14-6 Δ | 14-7 Δ |

| O distribution concentration $C_1$ (atomic %) | B distribution concentration $C_{(III)1}$ (atomic ppm) | | | | |
|---|---|---|---|---|---|
| | 80 Sample No./Evaluation | 100 Sample No./Evaluation | 200 Sample No./Evaluation | 400 Sample No./Evaluation | 800 Sample No./Evaluation |
| 0.01 | 1-8 Δ | 1-9 Δ | 1-10 Δ | 1-11 Δ | 1-12 Δ |
| 0.03 | 2-8 Δ | 2-9 Δ | 2-10 Δ | 2-11 Δ | 2-12 Δ |
| 0.05 | 3-8 Δ | 3-9 Δ | 3-10 Δ | 3-11 Δ | 3-12 Δ |
| 0.1 | 4-8 Δ | 4-9 Δ | 4-10 Δ | 4-11 Δ | 4-12 Δ |
| 0.3 | 5-8 ○ | 5-9 ○ | 5-10 ○ | 5-11 | 5-12 |

TABLE 2-continued

| | | | | ⦿ | ⦿ |
|---|---|---|---|---|---|
| 0.5 | 6-8 ○ | 6-9 ○ | 6-10 ○ | 6-11 Δ | 6-12 Δ |
| 1 | 7-8 ⦿ | 7-9 ○ | 7-10 ○ | 7-11 Δ | 7-12 Δ |
| 2 | 8-8 ⦿ | 8-9 ⦿ | 8-10 ○ | 8-11 ○ | 8-12 Δ |
| 3.5 | 9-8 ⦿ | 9-9 ⦿ | 9-10 ⦿ | 9-11 ○ | 9-12 Δ |
| 5 | 10-8 ⦿ | 10-9 ⦿ | 10-10 ○ | 10-11 ○ | 10-12 Δ |
| 7 | 11-8 ⦿ | 11-9 ⦿ | 11-10 ○ | 11-11 Δ | 11-12 Δ |
| 10 | 12-8 ⦿ | 12-9 ⦿ | 12-10 ○ | 12-11 Δ | 12-12 Δ |
| 20 | 13-8 ○ | 13-9 ○ | 13-10 ○ | 13-11 Δ | 13-12 Δ |
| 30 | 14-8 Δ | 14-9 Δ | 14-10 Δ | 14-11 Δ | 14-12 Δ |

Evaluation standards
⦿ Excellent
○ Good
Δ Practically satisfactory

EXAMPLE 2

Image forming members for electrophotography were prepared by carrying out formation of amorphous layers having the layer constitution as shown in FIG. 3 on Al cylinders by means of the preparation device as shown in FIG. 8, with the contents of boron (B) and oxygen (O) in the layers being as parameters. The preparation conditions for respective layer regions constituting the amorphous layers are shown in Table 3 below.

Distribution concentration of oxygen $C_1$ ... 3.5 atomic %

Distribution concentration of boron $C_{(III)1}$ ... 80 atomic ppm

Using the image forming members for electrophotography obtained, toner images were formed repeatedly on transfer papers by applying similarly the electrophotographic process as in Example 1, whereby transferred toner images on high quality could be obtained stably.

EXAMPLE 3

Image forming members for electrophotography were prepared by carrying out formation of amorphous layers having the layer constitution as shown in FIG. 4 on Al cylinders by means of the preparation device as shown in FIG. 8, with the contents of boron (B) and oxygen (O) in the layers being as parameters. The preparation conditions for respective layer regions constituting the amorphous layers are shown in Table 4 below.

Distribution concentration of oxygen $C_1$ ... 7 atomic %

Distribution concentration of boron $C_{(III)1}$ ... 30 atomic ppm

Using the image forming members for electrophotography obtained, toner images were formed repeatedly on transfer papers by applying similarly the electrophotographic process as in Example 1, whereby transferred toner images of high quality could be obtained stably.

TABLE 3

| Amorphous layer constitution | Gases employed (vol. %) | Flow rate (SCCM) | Flow rate ratio | Layer formation rate (Å/S) | Layer thickness (μ) | Discharging power (W/cm²) | Substrate temperature (°C.) | Pressure during reaction (torr) |
|---|---|---|---|---|---|---|---|---|
| layer region ($t_2t_B$) | $SiH_4/He = 0.5$<br>NO 100<br>$B_2H_6/He = 3 \times 10^{-3}$ | $SiH_4 = 200$ | $NO/SiH_4 = 4 \times 10^{-2}$ | 20 | 20 | 0.18 | 250 | 0.5 |
| Layer region ($t_1t_2$) | $SiH_4/He = 0.5$<br>NO 100<br>$B_2H_6/He = 3 \times 10^{-3}$ | $SiH_4 = 200$ | $NO/SiH_4 =$<br>$4 \times 10^{-2} \sim 2 \times 10^{-2}$<br>$B_2H_6/SiH_4 =$<br>$8 \times 10^{-5}$ | 20 | 0.5 | 0.18 | 250 | 0.5 |
| Layer region ($t_3t_1$) | $SiH_4/He = 0.5$<br>NO 100<br>$B_2H_6/He = 3 \times 10^{-3}$ | $SiH_4 = 200$ | $NO/SiH_4 = 2 \times 10^{-2} \sim 0$<br>$B_2H_6/SiH_4 = 8 \times 10^{-5} \sim 0$ | 20 | 0.5 | 0.18 | 250 | 0.5 |

Discharging frequency: 13.56 MHz
Note:
The swung dash represents "changing flow rate ratio from one value to another." The same note applys to the subsequent other tables.

TABLE 4

| Amorphous layer constitution | Gases employed (vol %) | Flow rate (SCCM) | Flow rate ratio | Layer formation rate (Å/S) | Layer thickness (μ) | Discharging power (W/cm²) | Substrate temperature (°C.) | Pressure during reaction (torr) |
|---|---|---|---|---|---|---|---|---|
| Layer region ($t_2t_B$) | $SiH_4/He = 0.5$<br>NO 100<br>$B_2H_6/He = 3 \times 10^{-3}$ | $SiH_4 = 200$ | $NO/SiH_4 = 8 \times 10^{-2}$<br>$B_2H_6/SiH_4 = 3 \times 10^{-5}$ | 20 | 20 | 0.2 | 250 | 0.5 |
| Layer | $SiH_4/He = 0.5$ | $SiH_4 = 200$ | $NO/SiH_4 = 8 \times 10^{-2}$ | 20 | 0.5 | 0.2 | 250 | 0.5 |

TABLE 4-continued

| Amorphous layer constitution | Gases employed (vol %) | Flow rate (SCCM) | Flow rate ratio | Layer formation rate (Å/S) | Layer thickness (μ) | Discharging power (W/cm²) | Substrate temperature (°C.) | Pressure during reaction (torr) |
| --- | --- | --- | --- | --- | --- | --- | --- | --- |
| region ($t_1t_2$) Layer region ($t_st_1$) | NO 100 $B_2H_6/He = 3 \times 10^{-3}$ $SiH_4/He = 0.5$ NO 100 $B_2H_6/He = 3 \times 10^{-3}$ | $SiH_4 = 200$ | $B_2H_6/SiH_4 = 3.0 \times 10^{-5} \sim 1.5 \times 10^{-5}$ $NO/SiH_4 = 8 \times 10^{-2} \sim 0$ $B_2H_6/SiH_4 = 1.5 \times 10^{-5} \sim 0$ | 20 | 0.5 | 0.2 | 250 | 0.5 |

Discharging frequency: 13.56 MHz

EXAMPLE 4

Image forming members for electrophotography were prepared by carrying out formation of amorphous layers having the layer constitution as shown in FIG. 5 on Al cylinders by means of the preparation device as shown in FIG. 8, with the contents of boron (B) and oxygen (O) in the layers being as parameters. The preparation conditions for respective layer regions constituting the amorphous layers are shown in Table 5 below.

Distribution concentration of oxygen $C_1$ ... 7 atomic %

Distribution concentration of boron $C_{(III)1}$ ... 10 atomic ppm

Distribution concentration of boron $C_{(III)3}$ ... see Table 6

Using the image forming members for electrophotography obtained, toner images were formed repeatedly on transfer papers by applying similarly the electrophotographic process as in Example 1, to obtain the evaluations as shown in Table 6.

In Table 5, X(4) means the following:

S4-1 ... $1 \times 10^{-7}$     S4-2 ... $5 \times 10^{-7}$

-continued

S4-3 ... $1 \times 10^{-6}$     S4-4 ... $5 \times 10^{-6}$

TABLE 5

| Amorphous layer constitution | Gases employed (vol %) | Flow rate (SCCM) | Flow rate ratio | Layer formation rate (Å/S) | Layer thickness (μ) | Discharging power (W/cm²) | Substrate temperature (°C.) | Pressure during reaction (torr) |
| --- | --- | --- | --- | --- | --- | --- | --- | --- |
| Layer region ($t_2t_B$) | $SiH_4/He = 0.5$ NO 100 $B_2H_6/He = 3 \times 10^{-3}$ | $SiH_4 = 200$ | $NO/SiH_4 = 8 \times 10^{-2}$ $B_2H_6/SiH_4 = 1 \times 10^{-5}$ | 18 | 20 | 0.18 | 250 | 0.5 |
| Layer region ($t_1t_2$) | $SiH_4/He = 0.5$ NO 100 $B_2H_6/He = 3 \times 10^{-3}$ | $SiH_4 = 200$ | $NO/SiH_4 = 8 \times 10^{-2} \sim 5 \times 10^{-2}$ $B_2H_6/SiH_4 = 1 \times 10^{-5}$ | 18 | 0.5 | 0.18 | 250 | 0.5 |
| Layer region ($t_st_1$) | $SiH_4/He = 0.5$ NO 100 $B_2H_6/He = 3 \times 10^{-3}$ | $SiH_4 = 200$ | $NO/SiH_4 = 5 \times 10^{-2} \sim 0$ $B_2H_6/SiH_4 = 1 \times 10^{-5} \sim X(4)$ | 18 | 0.3 | 0.18 | 250 | 0.5 |

Discharging frequency: 13.56 MHz

TABLE 6

| | B distribution concentration $C_{(III)3}$ (atomic ppm) | | | | | | | | |
| --- | --- | --- | --- | --- | --- | --- | --- | --- | --- |
| Example | 0.1 Sample No./ Evaluation | 0.5 Sample No./ Evaluation | 1 Sample No./ Evaluation | 5 Sample No./ Evaluation | 10 Sample No./ Evaluation | 20 Sample No./ Evaluation | 40 Sample No./ Evaluation | 80 Sample No./ Evaluation | 100 Sample No./ Evaluation |
| 4 | S4-1 Δ | S4-2 ○ | S4-3 ○ | S4-4 ◎ | | | | | |
| 5 | S5-1 Δ | S5-2 ○ | S5-3 ○ | S5-4 ◎ | S5-5 ◎ | S5-6 ○ | S5-7 ○ | S5-8 Δ | S5-9 Δ |
| 6 | S6-1 ○ | S6-2 ○ | S6-3 ◎ | S6-4 ◎ | S6-5 ◎ | S6-6 ○ | | | |
| 7 | S7-1 ○ | S7-2 ○ | S7-3 ◎ | S7-4 ◎ | S7-5 ◎ | S7-6 ○ | S7-7 ○ | S7-8 Δ | S7-9 Δ |

Evaluation standards are the same as in Table 2.

EXAMPLE 5

Image forming members for electrophotography were prepared by carrying out formation of amorphous layers having the layer constitution as shown in FIG. 6 on Al cylinders by means of the preparation device as shown in FIG. 8, with the contents of boron (B) and oxygen (O) in the layers being as parameters. The preparation conditions for respective layer regions constituting the amorphous layers are shown in Table 7 below.

Distribution concentration of oxygen $C_1$ ... 1 atomic %

Distribution concentration of boron $C_{(III)1}$ ... 100 atomic ppm

Distribution concentration of boron $C_{(III)3}$ ... see Table 6

Using the image forming members for electrophotography obtained, respectively, toner images were formed repeatedly on transfer papers by applying similarly the electrophotographic process as in Example 1, to obtain the evaluations as shown in Table 6.

In Table 7, X(5) means the following:

| | |
|---|---|
| S5-1 ... $1 \times 10^{-7}$ | S5-2 ... $5 \times 10^{-7}$ |
| S5-3 ... $1 \times 10^{-6}$ | S5-4 ... $5 \times 10^{-6}$ |

-continued

| | |
|---|---|
| S6-3 ... $1 \times 10^{-6}$ | S6-4 ... $5 \times 10^{-6}$ |
| S6-5 ... $1 \times 10^{-5}$ | S6-6 ... $2 \times 10^{-5}$ |

TABLE 8

| Amorphous layer consititution | Gases employed (vol. %) | Flow rate (SCCM) | Flow rate ratio | Layer formation rate (Å/S) | Layer thickness ($\mu$) | Discharging power (W/cm$^2$) | Substrate temperature (°C.) | Pressure during reaction (torr) |
|---|---|---|---|---|---|---|---|---|
| Layer region ($t_2t_B$) | SiH$_4$/He = 0.5<br>NO 100<br>B$_2$H$_6$/He = $3 \times 10^{-3}$ | SiH$_4$ = 200 | NO/SiH$_4$ = $2.2 \times 10^{-2}$<br>B$_2$H$_6$/SiH$_4$ = $3 \times 10^{-5}$ | 20 | 20 | 0.2 | 250 | 0.5 |
| Layer region ($t_1t_2$) | SiH$_4$/He = 0.5<br>NO 100<br>B$_2$H$_6$/He = $3 \times 10^{-3}$ | SiH$_4$ = 200 | NO/SiH$_4$ = $2.2 \times 10^{-2}$ ~ $1.38 \times 10^{-2}$<br>B$_2$H$_6$/SiH$_4$ = $3 \times 10^{-5}$ | 20 | 0.5 | 0.2 | 250 | 0.5 |
| Layer region ($t_st_1$) | SiH$_4$/He = 0.5<br>NO 100<br>B$_2$H$_6$/He = $3 \times 10^{-3}$ | SiH$_4$ = 200 | NO/SiH$_4$ = $1.38 \times 10^{-2}$~0<br>B$_2$H$_6$/SiH$_4$ =<br>$3 \times 10^{-5}$~X(6) | 20 | 0.3 | 0.2 | 250 | 0.5 |

Discharging frequency: 13.56 MHz

| | |
|---|---|
| S5-5 ... $1 \times 10^{-5}$ | S5-6 ... $2 \times 10^{-5}$ |
| S5-7 ... $1 \times 10^{-5}$ | S5-8 ... $8 \times 10^{-5}$ |
| S5-9 ... $6 \times 10^{-5}$ | |

TABLE 7

| Amorphous layer consititution | Gases employed (vol. %) | Flow rate (SCCM) | Flow rate ratio | Layer formation rate (Å/S) | Layer thickness ($\mu$) | Discharging power (W/cm$^2$) | Substrate temperature (°C.) | Pressure during reaction (torr) |
|---|---|---|---|---|---|---|---|---|
| Layer region ($t_2t_B$) | SiH$_4$/He = 0.5<br>NO 100<br>B$_2$H$_6$/He = $3 \times 10^{-3}$ | SiH$_4$ = 200 | NO/SiH$_4$ = $1.1 \times 10^{-2}$<br>B$_2$H$_6$/SiH$_4$ = $8 \times 10^{-5}$ | 20 | 20 | 0.2 | 250 | 0.5 |
| Layer region ($t_1t_2$) | SiH$_4$/He = 0.5<br>NO 100<br>B$_2$H$_6$/He = $3 \times 10^{-3}$ | SiH$_4$ = 200 | NO/SiH$_4$ =<br>$1.1 \times 10^{-2}$~$7.4 \times 10^{-3}$<br>B$_2$H$_6$/SiH$_4$ =<br>$8 \times 10^{-5}$~X(5) | 20 | 1.0 | 0.2 | 250 | 0.5 |
| Layer region ($t_st_1$) | SiH$_4$/He = 0.5<br>NO 100<br>B$_2$H$_6$/He = $3 \times 10^{-3}$ | SiH$_4$ = 200 | NO/SiH$_4$ = $7.4 \times 10^{-3}$~0<br>B$_2$H$_6$/SiH$_4$ = X(5) | 20 | 0.5 | 0.2 | 250 | 0.5 |

Discharging frequency: 13.56 MHz

EXAMPLE 6

Image forming members for electrophotography were prepared by carrying out formation of amorphous layers having the layer constitution as shown in FIG. 5 on Al cylinders by means of the preparation device as shown in FIG. 8, with the contents of boron (B) and oxygen (O) in the layers being as parameters. The preparation conditions for respective layer regions constituting the amorphous layers are shown in Table 8 below.

Distribution concentration of oxygen $C_1$ ... 2 atomic %

Distribution concentration of boron $C_{(III)1}$ ... 30 atomic %

Distribution concentration of boron $C_{(III)3}$ ... see Table 6

Using the image forming members for electrophotography obtained, respectively, toner images were formed repeatedly on transfer papers by applying similarly the electrophotographic process as in Example 1, to obtain the evaluations as shown in Table 6.

In Table 8, X(6) means the following:

| | |
|---|---|
| S6-1 ... $1 \times 10^{-7}$ | S6-2 ... $5 \times 10^{-7}$ |

EXAMPLE 7

Image forming members for electrophotography were prepared by carrying out formation of amorphous layers having the layer constitution as shown in FIG. 6 on Al cylinders by means of the preparation device as shown in FIG. 8, with the contents of boron (B) and oxygen (O) in the layers being as parameters. The preparation conditions for respective layer regions constituting the amorphous layers are shown in Table 9 below.

Distribution concentration of oxygen $C_1$ ... 2 atomic %

Distribution concentration of boron $C_{(III)1}$ ... 200 atomic ppm

Distribution concentration of boron $C_{(III)3}$ ... see Table 6

Using the image forming members for electrophotography obtained, respectively, toner images were formed repeatedly on transfer papers by applying similarly the electrophotographic process as in Example 1, to obtain the evaluation as shown in Table 6.

In Table 9, X(7) means the following:

| | |
|---|---|
| S7-1 ... $1 \times 10^{-7}$ | S7-2 ... $5 \times 10^{-7}$ |
| S7-3 ... $1 \times 10^{-6}$ | S7-4 ... $5 \times 10^{-6}$ |
| S7-5 ... $1 \times 10^{-5}$ | S7-6 ... $2 \times 10^{-5}$ |
| S7-7 ... $4 \times 10^{-5}$ | S7-8 ... $8 \times 10^{-5}$ |
| S7-9 ... $1 \times 10^{-4}$ | |

TABLE 9

| Amorphous layer constitution | Gases employed (vol. %) | Flow rate (SCCM) | Flow rate ratio | Layer formation rate (Å/S) | Layer thickness ($\mu$) | Discharging power (W/cm$^2$) | Substrate temperature (°C.) | Pressure during reaction (torr) |
|---|---|---|---|---|---|---|---|---|
| Layer region ($t_2 t_B$) | SiH$_4$/He = 0.5 NO 100 B$_2$H$_6$/He = 3 × 10$^{-3}$ | SiH$_4$ = 200 | NO/SiH$_4$ = 2.2 × 10$^{-2}$ B$_2$H$_6$/SiH$_4$ = 2 × 10$^{-4}$ | 20 | 20 | 0.2 | 250 | 0.5 |
| Layer region ($t_1 t_2$) | SiH$_4$/He = 0.5 NO 100 B$_2$H$_6$/He = 3 × 10$^{-3}$ | SiH$_4$ = 200 | NO/SiH$_4$ = 2.2 × 10$^{-2}$ ~ 1.47 × 10$^{-2}$ B$_2$H$_6$/SiH$_4$ = 2 × 10$^{-4}$ ~ X(7) | 20 | 0.3 | 0.2 | 250 | 0.5 |
| Layer region ($t_s t_1$) | SiH$_4$/He = 0.5 No 100 B$_2$H$_6$/He = 3 × 10$^{-3}$ | SiH$_4$ = 200 | NO/SiH$_4$ = 1.47 × 10$^{-2}$~0 B$_2$H$_6$/SiH$_4$ = X(7) | 20 | 1.0 | 0.2 | 250 | 0.5 |

Discharging frequency: 13.56 MHz

EXAMPLE 8

Image forming members for electrophotography were prepared by carrying out formation of amorphous layers having the layer constitution as shown in FIG. 7 on Al cylinders by means of the preparation device as shown in FIG. 8, with the thicknesses of the layer region ($t_1 t_2$) and the layer region ($t_2 t_3$) being as parameters. The preparation conditions for respective layer regions constituting the amorphous layers are shown in Table 10 below.

Distribution concentration of oxygen C$_1$ ... 7 atomic %

Distribution concentration of boron C$_{(III)1}$ ... 100 atomic ppm

Using the image forming members for electrophotography obtained, respectively, toner images were formed repeatedly on transfer papers by applying similarly the electrophotographic process as in Example 1, to obtain the evaluations as shown in Table 11.

EXAMPLE 9

Image forming members for electrophotography were prepared by carrying out formation of amorphous layers having the layer constitution as shown in FIG. 2 on Al cylinders by means of the preparation device as shown in FIG. 8, with the contents of boron (B) and oxygen (O) in the layers being as parameters. The preparation conditions for respective layer regions constituting the amorphous layers are shown in Table 12 below.

Distribution concentration of oxygen C$_1$ ... 3.5 atomic %

Distribution concentration of boron C$_{(III)1}$ ... 80 atomic ppm

Distribution concentration of boron C$_{(III)2}$ ... 500 atomic ppm

Using the image forming members for electrophotography obtained, toner images were formed repeatedly on transfer papers by applying similarly the electrophotographic process as in Example 1, whereby transferred

TABLE 10

| Amorphous layer constitution | Gases employed (vol. %) | Flow rate (SCCM) | Flow rate ratio | Layer formation rate (Å/S) | Layer thickness ($\mu$) | Discharging power (W/cm$^2$) | Substrate temperature (°C.) | Pressure during reaction (torr) |
|---|---|---|---|---|---|---|---|---|
| Layer region ($t_2 t_B$) | SiH$_4$/He = 0.5 NO 100 B$_2$H$_6$/He = 3 × 10$^{-3}$ | SiH$_4$ = 200 | NO/SiH$_4$ = 7.7 × 10$^{-2}$ B$_2$H$_6$/SiH$_4$ = 8 × 10$^{-5}$ | 20 | 20 | 0.2 | 250 | 0.5 |
| Layer region ($t_1 t_2$) | SiH$_4$/He = 0.5 NO 100 B$_2$H$_6$/He = 3 × 10$^{-3}$ | SiH$_4$ = 200 | NO/SiH$_4$ = 7.7 × 10$^{-2}$~ 3.85 × 10$^{-2}$ B$_2$H$_6$/SiH$_4$ = 8 × 10$^{-5}$~0 | 20 | 0.5 | 0.2 | 250 | 0.5 |
| Layer region ($t_s t_1$) | SiH$_4$/He = 0.5 NO 100 | SiH$_4$ = 200 | NO/SiH$_4$ = 3.85 × 10$^{-2}$~0 | 20 | 0.5 | 0.2 | 250 | 0.5 |

Discharging frequency: 13.56 MHz toner images of high quality could be obtained stably.

TABLE 11

| | Layer Region ($t_1 t_2$) ($\mu$m) | | | | |
|---|---|---|---|---|---|
| Layer region ($t_2 t_3$) ($\mu$m) | 0.1 Sample No./ Evaluation | 0.5 Sample No./ Evaluation | 1.0 Sample No./ Evaluation | 4 Sample No./ Evaluation | 8 Sample No./ Evaluation |
| 0.1 | S8-11 ○ | S8-12 ○ | S8-13 ○ | S8-14 ○ | S8-15 ◎ |
| 0.2 | S8-21 ○ | S8-22 ◎ | S8-23 ◎ | S8-24 ◎ | S8-25 ◎ |
| 1.0 | S8-31 ○ | S8-32 ◎ | S8-33 ◎ | S8-34 ◎ | S8-35 ◎ |
| 4 | S8-41 ○ | S8-42 ◎ | S8-43 ◎ | S8-44 ◎ | S8-45 ◎ |
| 8 | S8-51 ◎ | S8-52 ◎ | S8-53 ◎ | S8-54 ◎ | S8-55 ◎ |

Evaluation standards are the same as in Table 2.

TABLE 12

| Amorphous layer constitution | Gases employed (vol. %) | Flow rate (SCCM) | Flow rate ratio | Layer formation rate (Å/S) | Layer thickness (μ) | Discharging power (W/cm²) | Substrate temperature (°C.) | Pressure during reaction (torr) |
|---|---|---|---|---|---|---|---|---|
| Layer region ($t_3t_B$) | $SiH_4/He = 0.5$<br>NO 100<br>$B_2H_6 = 3.3 \times 10^{-3}$ | $SiH_4 = 200$ | $NO/SiH_4 = 4 \times 10^{-2}$<br>$B_2H_6/SiH_4 = 5 \times 10^{-4}$ | 20 | 0.3 | 0.2 | 250 | 0.5 |
| Layer region ($t_1t_3$) | $SiH_4/He = 0.5$<br>NO 100<br>$B_2H_6/He = 3.3 \times 10^{-3}$ | $SiH_4 = 200$ | $NO/SiH_4 = 4 \times 10^{-2}$<br>$B_2H_6/SiH_4 = 8 \times 10^{-5}$ | 20 | 20 | 0.2 | 250 | 0.5 |
| Layer region ($t_st_1$) | $SiH_4/He = 0.5$<br>NO 100<br>$B_2H_6/He = 3.3 \times 10^{-3}$ | $SiH_4 = 200$ | $NO/SiH_4 = 4 \times 10^{-2} \sim 0$<br>$B_2H_6/SiH_4 = 8 \times 10^{-5} \sim 0$ | 20 | 1 | 0.2 | 250 | 0.5 |

Discharging frequency: 13.56 MHz

EXAMPLE 10

After amorphous layers having the layer constituting as shown in FIG. 3 were formed on Al cylinders according to the same procedure under the same conditions as in Example 2, silicon carbide type surface barrier layers were formed on said amorphous layers in accordance with the conditions as shown below. The thus prepared samples were subjected to the electrophotographic process as in Example 1 repeatedly to obtain toner transferred images. As the result, even the one millionth toner transferred image was also found to be of very high quality, comparable to the first toner transferred image.

Gases employed . . . $CH_4.SiH_4/He = 10:250$
Flow rate . . . $SiH_4 = 10$ SCCM
Flow rate ratio . . . $CH_4/SiH_4 = 30$
Layer formation rate . . . 0.84 Å/sec
Discharging power . . . 0.18 W/cm²
Substrate temperature . . . 250° C.
Pressure during reaction . . . 0.5 Torr

EXAMPLE 11

After amorphous layers were formed on Al cylinders according to the same procedures under the same conditions as in Samples No. S4-1–S4-4, S5-1–S5-9, S6-1–S6-6 and S7-1–S7-9 in Examples 4–7, silicon carbide type surface barrier layers were formed on respective amorphous layers in accordance with the same procedure and conditions as in Example 10 to obtain 28 samples (Sample Nos. S11-1–S11-28). For each of the samples, there was applied the electrophotographic process as in Example 1 to form repeatedly toner images on predetermined respective transfer papers, whereby toner images of high quality and high resolution could be obtained on all of the transfer papers.

EXAMPLE 12

Image forming members for electrophotography were prepared by carrying out formation of amorphous layers having the layer constitution as shown in FIG. 3 on Al cylinders by means of the preparation device as shown in FIG. 8, with the contents of boron (B) and oxygen (O) in the layers being as parameters. The preparation conditions for respective layer regions constituting the amorphous layers are shown in Table 13 below.

Distribution concentration of oxygen $C_1$ . . . 3.5 atomic %
Distribution concentration of boron $C_{(III)1}$ . . . 80 atomic ppm Using the image forming members for electrophotography obtained, toner images were formed repeatedly on transfer papers by applying similarly the electrophotographic process as in Example 1, whereby transferred toner images of high quality could be obtained stably.

TABLE 13

| Amorphous layer constitution | Gases employed (vol. %) | Flow rate (SCCM) | Flow rate ratio | Layer formation rate (Å/S) | Layer thickness (μ) | Discharging power (W/cm²) | Substrate temperature (°C.) | Pressure during reaction (torr) |
|---|---|---|---|---|---|---|---|---|
| Layer region ($t_2t_B$) | $SiH_4/He = 0.5$<br>$SiF_4/He = 0.5$<br>NO 100<br>$B_2H_6/He = 3 \times 10^{-3}$ | $SiH_4 = 200$ | $NO/(SiH_4 + SiF_4) = 4 \times 10^{-2}$<br>$SiF_4/SiH_4 = 0.2$<br>$B_2H_6/(SiH_4 + SiF_4) = 8 \times 10^{-5}$ | 20 | 20 | 0.18 | 250 | 0.5 |
| Layer region ($t_1t_2$) | $SiH_4/He = 0.5$<br>$SiF_4/He = 0.5$<br>NO 100<br>$B_2H_6/He = 3 \times 10^{-3}$ | $SiH_4 = 200$ | $NO/(SiH_4 + SiF_4) = 4 \times 10^{-2} \sim 2 \times 10^{-2}$<br>$SiF_4/SiH_4 = 0.2$<br>$B_2H_6/(SiH_4 + SiF_4) = 8 \times 10^{-5}$ | 20 | 0.5 | 0.18 | 250 | 0.5 |
| Layer region ($t_st_1$) | $SiH_4/He = 0.5$<br>$SiF_4/He = 0.5$<br>NO 100<br>$B_2H_6/He = 3 \times 10^{-3}$ | $SiH_4 = 200$ | $NO/(SiH_4 + SiF_4) = 2 \times 10^{-2} \sim 0$<br>$SiF_4/SiH_4 = 0.2$<br>$B_2H_6/(SiH_4 + SiF_4) = 8 \times 10^{-5} \sim 0$ | 20 | 0.5 | 0.18 | 250 | 0.5 |

Discharging frequency: 13.56 MHz

EXAMPLE 13

Image forming members for electrophotography were prepared by carrying out formation of amorphous layers having the layer constitution as shown in FIG. 2 on Al cylinders by means of the preparation device as shown in FIG. 8, with the contents of boron (B) and nitrogen (N) in the layers being as parameters. The common preparation conditions are as shown in Table 14.

In Table 15, there are shown the results of evaluation for respective samples, with contents of boron $C_{(III)1}$ represented on the axis of ordinate and the contents of nitrogen $C_1$ on the axis of abscissa, respectively.

The image forming members for electrophotography prepared were subjected to a series of electrophotographic process of charging-imagewise exposure-development-transfer, and overall evaluations of the results with respect to density, resolution, tone reproducibility, etc. were performed for the images visualized on transfer papers.

TABLE 14

| Amorphous layer constitution | Gases employed (vol %) | Flow rate (SCCM) | Layer formation rate (Å/S) | Layer thickness (μ) | Discharging power (W/cm²) | Substrate temperature (°C.) | Pressure during reaction (torr) | Discharging frequency (MHz) |
|---|---|---|---|---|---|---|---|---|
| Layer region ($t_1 t_B$) | $SiH_4/He = 0.5$ $NH_3\ 100$ $B_2H_6/He = 3 \times 10^{-3}$ | $SiH_4 = 200$ suitably changed depending on samples | 16 | 20 | 0.2 | 250 | 0.5 | 13.56 |
| Layer region ($t_s t_1$) | $SiH_4/He = 0.5$ $NH_3\ 100$ $B_2H_6/He = 3 \times 10^{-3}$ | $SiH_4 = 200$ suitably changed continuously | 16 | 1 | 0.2 | 250 | 0.5 | 13.56 |

TABLE 15

| N distribution concentration $C_1$ (atomic %) | B distribution concentration $C_{(III)1}$ (atomic ppm) | | | | | | | |
|---|---|---|---|---|---|---|---|---|
| | 0.1 Sample No./Evaluation | 0.5 Sample No./Evaluation | 1 Sample No./Evaluation | 5 Sample No./Evaluation | 10 Sample No./Evaluation | 30 Sample No./Evaluation | 50 Sample No./Evaluation | 80 Sample No./Evaluation |
| 0.01 | μ1-1 Δ | μ1-2 Δ | μ1-3 Δ | μ1-4 ○ | μ1-5 ○ | μ1-6 Δ | μ1-7 Δ | μ1-8 Δ |
| 0.03 | μ2-1 Δ | μ2-2 Δ | μ2-3 Δ | μ2-4 ○ | μ2-5 ○ | μ2-6 Δ | μ2-7 Δ | μ2-8 Δ |
| 0.05 | μ3-1 Δ | μ3-2 Δ | μ3-3 Δ | μ3-4 ○ | μ3-5 ○ | μ3-6 ○ | μ3-7 Δ | μ3-8 Δ |
| 0.1 | μ4-1 Δ | μ4-2 Δ | μ4-3 Δ | μ4-4 ○ | μ4-5 ○ | μ4-6 ○ | μ4-7 ○ | μ4-8 Δ |
| 0.3 | μ5-1 Δ | μ5-2 Δ | μ5-3 Δ | μ5-4 ○ | μ5-5 ○ | μ5-6 ○ | μ5-7 ◎ | μ5-8 ◎ |
| 0.5 | μ6-1 Δ | μ6-2 Δ | μ6-3 Δ | μ6-4 ○ | μ6-5 ○ | μ6-6 ○ | μ6-7 ◎ | μ6-8 ◎ |
| 1 | μ7-1 Δ | μ7-2 Δ | μ7-3 Δ | μ7-4 ○ | μ7-5 ○ | μ7-6 ○ | μ7-7 ◎ | μ7-8 ◎ |
| 2 | μ8-1 Δ | μ8-2 Δ | μ8-3 ○ | μ8-4 ○ | μ8-5 ○ | μ8-6 ○ | μ8-7 ◎ | μ8-8 ◎ |
| 3.5 | μ9-1 Δ | μ9-2 Δ | μ9-3 ○ | μ9-4 ○ | μ9-5 ○ | μ9-6 ○ | μ9-7 ◎ | μ9-8 ◎ |
| 5 | μ10-1 Δ | μ10-2 Δ | μ10-3 ○ | μ10-4 ○ | μ10-5 ○ | μ10-6 ○ | μ10-7 ○ | μ10-8 ◎ |
| 7 | μ11-1 Δ | μ11-2 Δ | μ11-3 Δ | μ11-4 ○ | μ11-5 ○ | μ11-6 ○ | μ11-7 ○ | μ11-8 ◎ |
| 10 | μ12-1 Δ | μ12-2 Δ | μ12-3 Δ | μ12-4 Δ | μ12-5 Δ | μ12-6 Δ | μ12-7 Δ | μ12-8 Δ |
| 20 | μ13-1 Δ | μ13-2 Δ | μ13-3 Δ | μ13-4 Δ | μ13-5 Δ | μ13-6 Δ | μ13-7 Δ | μ13-8 Δ |
| 30 | μ14-1 Δ | μ14-2 Δ | μ14-3 Δ | μ14-4 Δ | μ14-5 Δ | μ14-6 Δ | μ14-7 Δ | μ14-8 Δ |

| N distribution concentration $C_1$ (atomic %) | B distribution concentration $C_{(III)1}$ (atomic ppm) | | | | |
|---|---|---|---|---|---|
| | 100 Sample No./Evaluation | 200 Sample No./Evaluation | 400 Sample No./Evaluation | 800 Sample No./Evaluation | 1500 Sample No./Evaluation |
| 0.01 | μ1-9 Δ | μ1-10 Δ | μ1-11 Δ | μ1-12 Δ | μ1-13 Δ |
| 0.03 | μ2-9 Δ | μ2-10 Δ | μ2-11 Δ | μ2-12 Δ | μ2-13 Δ |
| 0.05 | μ3-9 Δ | μ3-10 Δ | μ3-11 Δ | μ3-12 Δ | μ3-13 Δ |
| 0.1 | μ4-9 Δ | μ4-10 Δ | μ4-11 Δ | μ4-12 Δ | μ4-13 Δ |
| 0.3 | μ5-9 ◎ | μ5-10 ○ | μ5-11 ○ | μ5-12 Δ | μ5-13 Δ |
| 0.5 | μ6-9 ◎ | μ6-10 ○ | μ6-11 ○ | μ6-12 ○ | μ6-13 Δ |
| 1 | μ7-9 ◎ | μ7-10 ◎ | μ7-11 ◎ | μ7-12 ○ | μ7-13 Δ |
| 2 | μ8-9 ◎ | μ8-10 ◎ | μ8-11 ◎ | μ8-12 ○ | μ8-13 Δ |
| 3.5 | μ9-9 ◎ | μ9-10 ◎ | μ9-11 ◎ | μ9-12 ◎ | |

TABLE 15-continued

| | | | | | | Δ |
|---|---|---|---|---|---|---|
| | 5 | μ10-9 ◎ | μ10-10 ◎ | μ10-11 ◎ | μ10-12 ○ | μ10-13 Δ |
| | 7 | μ11-9 ◎ | μ11-10 ◎ | μ11-11 ◎ | μ11-12 ○ | μ11-13 Δ |
| | 10 | μ12-9 Δ | μ12-10 Δ | μ12-11 Δ | μ12-12 Δ | μ12-13 Δ |
| | 20 | μ13-9 Δ | μ13-10 Δ | μ13-11 Δ | μ13-12 Δ | μ13-13 Δ |
| | 30 | μ14-9 Δ | μ14-10 Δ | μ14-11 Δ | μ14-12 Δ | μ14-13 Δ |

Evaluation standards
◎ Excellent
○ Good
Δ Practically satisfactory

EXAMPLE 14

Image forming members for electrophotography were prepared by carrying out formation of amorphous layers having the layer constitution as shown in FIG. 3 on Al cylinders by means of the preparation device as shown in FIG. 8, with the contents of boron (B) and nitrogen (N) in the layers being as parameters. The preparation conditions for respective layer regions constituting the amorphous layers are shown in Table 16 below.

Using the image forming members for electrophotography obtained, toner images were formed repeatedly on transfer papers by applying similarly the electrophotographic process as in Example 13, whereby transferred toner images of high quality could be obtained stably.

TABLE 16

| Amorphous layer constitution | Gases employed (vol %) | Flow rate (SCCM) | Flow rate ratio | Layer formation rate (Å/S) | Layer thickness (μ) | Discharging power (W/cm²) | Substrate temperature (°C.) | Pressure during reaction (torr) |
|---|---|---|---|---|---|---|---|---|
| Layer region ($t_2 t_B$) | SiH$_4$/He = 0.5<br>NH$_3$ 100<br>B$_2$H$_6$/He = 3 × 10$^{-3}$ | SiH$_4$ = 200 | NH$_3$/SiH$_4$ = 8 × 10$^{-2}$ | 20 | 20 | 0.18 | 250 | 0.5 |
| Layer region ($t_2 t_B$) | SiH$_4$/He = 0.5<br>NH$_3$ 100<br>B$_2$H$_6$He = 3 × 10$^{-3}$ | SiH$_4$ = 200 | NH$_3$/SiH$_4$ = <br>8 × 10$^{-2}$~4 × 10$^{-2}$<br>B$_2$H$_6$/SiH$_4$ = 8 × 10$^{-5}$ | 20 | 0.5 | 0.18 | 250 | 0.5 |
| Layer region ($t_s t_1$) | SiH$_4$/He = 0.5<br>NH$_3$ 100<br>B$_2$H$_6$He = 3 × 10$^{-3}$ | SiH$_4$ = 200 | NH$_3$/SiH$_4$ = 4 × 10$^{-2}$~0<br>B$_2$H$_6$/SiH$_4$ = <br>8 × 10$^{-5}$~0 | 20 | 0.5 | 0.18 | 250 | 0.5 |

Discharging frequency: 13.56 MHz

EXAMPLE 15

Image forming members for electrophotography were prepared by carrying out formation of amorphous layers having the layer constitution as shown in FIG. 4 on Al cylinders by means of the preparation device as shown in FIG. 8, with the contents of boron (B) and nitrogen (N) in the layers being as parameters. The preparation conditions for respective layer constituting the amorphous layers are shown in Table 17 below.

Using the image forming members for electrophotography obtained, toner images were formed repeatedly on transfer papers by applying similarly the electrophotographic process as in Example 13, whereby transferred toner images of high quality could be obtained stably.

TABLE 17

| Amorphous layer constitution | Gases employed (vol %) | Flow rate (SCCM) | Flow rate ratio | Layer formation rate (Å/S) | Layer thickness (μ) | Discharging power (W/cm²) | Substrate temperature (°C.) | Pressure during reaction (torr) |
|---|---|---|---|---|---|---|---|---|
| Layer region ($t_2 t_B$) | SiH$_4$/He = 0.5<br>NH$_3$ 100<br>B$_2$H$_6$/He = 3 × 10$^{-3}$ | SiH$_4$ = 200 | NH$_3$/SiH$_4$ = 16 × 10$^{-2}$<br>B$_2$H$_6$/SiH$_4$ = 1 × 10$^{-4}$ | 20 | 20 | 0.2 | 250 | 0.5 |
| Layer region ($t_1 t_2$) | SiH$_4$/He = 0.5<br>NH$_3$ 100<br>B$_2$H$_6$/He = 3 × 10$^{-3}$ | SiH$_4$ = 200 | NH$_3$/SiH$_4$ = 16 × 10$^{-2}$<br>B$_2$H$_6$/SiH$_4$ = <br>1 × 10$^{-4}$~1.5 × 10$^{-5}$ | 20 | 0.5 | 0.2 | 250 | 0.5 |
| Layer region ($t_s t_1$) | SiH$_4$/He = 0.5<br>NH$_3$ 100<br>B$_2$H$_6$/He = 3 × 10$^{-3}$ | SiH$_4$ = 200 | NH$_3$/SiH$_4$ = 16 × 10$^{-2}$~0<br>B$_2$H$_6$/SiH$_4$ = <br>1.5 × 10$^{-5}$~0 | 20 | 0.5 | 0.2 | 250 | 0.5 |

Discharging frequency: 13.56 MHz

EXAMPLE 16

Image forming members for electrophotography were prepared by carrying out formation of amorphous layers having the layer constitution as shown in FIG. 5 on Al cylinders by means of the preparation device as shown in FIG. 8, with the contents of boron (B) and nitrogen (N) in the layers being as parameters. The preparation conditions for respective layer regions constituting the amorphous layers are shown in Table 18 below.

Using the image forming members for electrophotography obtained, toner images were formed repeatedly on transfer papers by applying similarly the electrophotographic process as in Example 13, to obtain the evaluations as shown in Table 19.

In Table 18, X(4) means the following:

NS4-1 ... $1 \times 10^{-7}$   NS4-2 ... $5 \times 10^{-7}$
NS4-3 ... $1 \times 10^{-6}$   NS4-4 ... $5 \times 10^{-6}$ stituting the amorphous layers are shown in Table 20 below.

Using the image forming members for electrophotography obtained, respectively, toner images were formed repeatedly on transfer papers by applying similarly the electrophotographic process as in Example 13, to obtain the evaluation as shown in Table 19.

In Table 20, X(s) means the following:

NS5-1 ... $1 \times 10^{-7}$   NS5-2 ... $5 \times 10^{-7}$

TABLE 18

| Amorphous layer constitution | Gases employed (vol %) | Flow rate (SCCM) | Flow rate ratio | Layer formation rate (Å/S) | Layer thickness (μ) | Discharging power (W/cm²) | Substrate temperature (°C.) | Pressure during reaction (torr) |
|---|---|---|---|---|---|---|---|---|
| Layer region ($t_2 t_B$) | SiH₄/He = 0.5  NH₃ 100  B₂H₆/He = 3 × 10⁻³ | SiH₄ = 200 | NH₃/SiH₄ = 16 × 10⁻²  B₂H₆/SiH₄ = 1 × 10⁻⁴ | 18 | 20 | 0.18 | 250 | 0.5 |
| Layer region ($t_1 t_2$) | SiH₄/He = 0.5  NH₃ 100  B₂H₆/He = 3 × 10⁻³ | SiH₄ = 200 | NH₃/SiH₄ = 16 × 10⁻²~5 × 10⁻²  B₂H₆/SiH₄ = 1 × 10⁻⁴ | 18 | 0.5 | 0.18 | 250 | 0.5 |
| Layer region ($t_s t_1$) | SiH₄/He = 0.5  NH₃ 100  B₂H₆/He = 3 × 10⁻³ | SiH₄ = 200 | NH₃/SiH₄ = 5 × 10⁻²~0  B₂H₆/SiH₄ = 1 × 10⁻⁴~X(4) | 18 | 0.3 | 0.18 | 250 | 0.5 |

Discharging frequency: 13.56 MHz

TABLE 19

| | B distribution concentration $C_{(III)3}$ (atomic ppm) | | | | | | | | |
|---|---|---|---|---|---|---|---|---|---|
| | 0.1 | 0.5 | 1 | 5 | 10 | 20 | 40 | 80 | 100 |
| Example | Sample No./ Evaluation | Sample No./ Evaluation | Sample No./ Evaluation | Sample No./ Evaluation | Sample No./ Evaluation | Sample No./ Evaluation | Sample No./ Evaluation | Sample No./ Evaluation | Sample No./ Evaluation |
| 16 | NS4-1 Δ | NS4-2 ○ | NS4-3 ○ | NS4-4 ◎ | | | | | |
| 17 | NS5-1 Δ | NS5-2 ○ | NS5-3 ○ | NS5-4 ◎ | NS5-5 ◎ | NS5-6 ○ | NS5-7 ○ | NS5-8 Δ | NS5-9 Δ |
| 18 | NS6-1 ○ | NS6-2 ○ | NS6-3 ◎ | NS6-4 ◎ | NS6-5 ◎ | NS6-6 ○ | | | |
| 19 | NS7-1 ○ | NS7-2 ○ | NS7-3 ◎ | NS7-4 ◎ | NS7-5 ◎ | NS7-6 ○ | NS7-7 ○ | NS7-8 Δ | NS7-9 Δ |

Evaluation standards are the same as in Table 2.

EXAMPLE 17

Image forming members for electrophotography were prepared by carrying out formation of amorphous layers having the layer constitution as shown in FIG. 6 on Al cylinders by means of the preparation device as shown in FIG. 8, with the contents of boron (B) and nitrogen (N) in the layers being as parameters. The preparation conditions for respective layer regions constituting the amorphous layers are shown in Table 20 below.

NS5-3 ... $1 \times 10^{-6}$   NS5-4 ... $5 \times 10^{-6}$
NS5-5 ... $1 \times 10^{-5}$   NS5-6 ... $5 \times 10^{-5}$
NS5-7 ... $3 \times 10^{-5}$   NS5-8 ... $4 \times 10^{-5}$
NS5-9 ... $6 \times 10^{-5}$

TABLE 20

| Amorphous layer constitution | Gases employed (vol %) | Flow rate (SCCM) | Flow rate ratio | Layer formation rate (Å/S) | Layer thickness (μ) | Discharging power (W/cm²) | Substrate temperature (°C.) | Pressure during reaction (torr) |
|---|---|---|---|---|---|---|---|---|
| Layer region ($t_2 t_B$) | SiH₄/He = 0.5  NH₃ 100  B₂H₆/He = 3 × 10⁻³ | SiH₄ = 200 | NH₃/SiH₄ = 2.2 × 10⁻²  B₂H₆/SiH₄ = 8 × 10⁻⁵ | 20 | 20 | 0.2 | 250 | 0.5 |
| Layer region ($t_1 t_2$) | SiH₄/He = 0.5  NH₃ 100  B₂H₆/He = 3 × 10⁻³ | SiH₄ = 200 | NH₃/SiH₄ = 2.2 × 10⁻²~7.4 × 10⁻³  B₂H₆/SiH₄ = 8 × 10⁻⁵~X(5) | 20 | 1.0 | 0.2 | 250 | 0.5 |
| Layer region ($t_s t_1$) | SiH₄/He = 0.5  NH₃ 100  B₂H₆/He = 3 × 10⁻³ | SiH₄ = 200 | NH₃/SiH₄ = 7.4 × 10⁻³~0  B₂H₆/SiH₄ = X(5) | 20 | 0.5 | 0.2 | 250 | 0.5 |

Discharging frequency: 13.56 MHz

EXAMPLE 18

Image forming members for electrophotography were prepared by carrying out formation of amorphous layers having the layer constitution as shown in FIG. 5 on Al cylinders by means of the preparation device as shown in FIG. 8, with the contents of boron (B) and nitrogen (N) in the layers being as parameters. The preparation conditions for respective layer regions constituting the amorphous layers are shown in Table 21 below.

Using the image forming members for electrophotography obtained, respectively, toner images were formed repeatedly on transfer papers by applying similarly the electrophotographic process as in Example 13, to obtain the evaluations as shown in Table 19.

In Table 21, X(6) means the following.

Using the image forming members for electrophotography obtained, respectively, toner images were formed repeatedly on transfer papers by applying similarly the electrophotographic process as in Example 13, to obtain the evaluations as shown in Table 19.

In Table 22, X(7) means the following:

| NS7-1 ... $1 \times 10^{-7}$ | NS7-2 ... $5 \times 10^{-7}$ |
| NS7-3 ... $1 \times 10^{-6}$ | NS7-4 ... $5 \times 10^{-6}$ |
| NS7-5 ... $1 \times 10^{-5}$ | NS7-6 ... $2 \times 10^{-5}$ |
| NS7-7 ... $4 \times 10^{-5}$ | NS7-8 ... $8 \times 10^{-5}$ |
| NS7-9 ... $1 \times 10^{-4}$ | |

TABLE 22

| Amorphous layer constitution | Gases employed (vol %) | Flow rate (SCCM) | Flow rate ratio | Layer formation rate (Å/S) | Layer thickness ($\mu$) | Discharging power (W/cm$^2$) | Substrate temperature (°C.) | Pressure during reaction (torr) |
|---|---|---|---|---|---|---|---|---|
| Layer region ($t_2 t_B$) | SiH$_4$/He = 0.5<br>NH$_3$ 100<br>B$_2$H$_6$/He = $3 \times 10^{-3}$ | SiH$_4$ = 200 | NH$_3$/SiH$_4$ = $4.4 \times 10^{-2}$<br>B$_2$H$_6$/SiH$_4$ = $2 \times 10^{-4}$ | 20 | 20 | 0.2 | 250 | 0.5 |
| Layer region ($t_1 t_2$) | SiH$_4$/He = 0.5<br>NH$_3$ 100<br>B$_2$H$_6$/He = $3 \times 10^{-3}$ | SiH$_4$ = 200 | NH$_3$/SiH$_4$ = $4.4 \times 10^{-2} \sim$<br>$1.47 \times 10^{-2}$<br>B$_2$H$_6$/SiH$_4$ =<br>$2 \times 10^{-4} \sim$X(7) | 20 | 0.3 | 0.2 | 250 | 0.5 |
| Layer region ($t_3 t_1$) | SiH$_4$/He = 0.5<br>NH$_3$ 100<br>B$_2$H$_6$/He = $3 \times 10^{-3}$ | SiH$_4$ = 200 | NH$_3$/SiH$_4$ =<br>$1.47 \times 10^{-2} \sim 0$<br>B$_2$H$_6$/SiH$_4$ = X(7) | 20 | 1.0 | 0.2 | 250 | 0.5 |

Discharging frequency: 13.56 MHz

| NS6-1 ... $1 \times 10^{-7}$ | NS6-2 ... $5 \times 10^{-7}$ |
| NS6-3 ... $1 \times 10^{-6}$ | NS6-4 ... $5 \times 10^{-6}$ |
| NS6-5 ... $1 \times 10^{-5}$ | NS6-6 ... $2 \times 10^{-5}$ |

TABLE 21

| Amorphous layer constitution | Gases employed (vol %) | Flow rate (SCCM) | Flow rate ratio | Layer formation rate (Å/S) | Layer thickness ($\mu$) | Discharging power (W/cm$^2$) | Substrate temperature (°C.) | Pressure during reaction (torr) |
|---|---|---|---|---|---|---|---|---|
| Layer region ($t_2 t_B$) | SiH$_4$/He = 0.5<br>NH$_3$ 100<br>B$_2$H$_6$/He = $3 \times 10^{-3}$ | SiH$_4$ = 200 | NH$_3$/SiH$_4$ = $4.4 \times 10^{-2}$<br>B$_2$H$_6$/SiH$_4$ = $3 \times 10^{-5}$ | 20 | 20 | 0.2 | 250 | 0.5 |
| Layer region ($t_1 t_2$) | SiH$_4$/He = 0.5<br>NH$_3$ 100<br>B$_2$H$_6$/He = $3 \times 10^{-3}$ | SiH$_4$ = 200 | NH$_3$/SiH$_4$ = $4.4 \times 10^{-2} \sim$<br>$1.38 \times 10^{-2}$<br>B$_2$H$_6$/SiH$_4$ = $3 \times 10^{-5}$ | 20 | 0.5 | 0.2 | 250 | 0.5 |
| Layer region ($t_3 t_1$) | SiH$_4$/He = 0.5<br>NH$_3$ 100<br>B$_2$H$_6$/He = $3 \times 10^{-3}$ | SiH$_4$ = 200 | NH$_3$/SiH$_4$ =<br>$1.38 \times 10^{-2} \sim 0$<br>B$_2$H$_6$/SiH$_4$ =<br>$3 \times 10^{-6} \sim$X(6) | 20 | 0.3 | 0.2 | 250 | 0.5 |

Discharging frequency: 13.56 MHz

EXAMPLE 19

Image forming members for electrophotography were prepared by carrying out formation of amorphous layers having the layer constitution as shown in FIG. 6 on Al cylinders by means of the preparation device as shown in FIG. 8, with the contents of boron (B) and nitrogen (N) in the layers being as parameters. The preparation conditions for respective layer regions constituting the amorphous layers are shown in Table 22 below.

EXAMPLE 20

Image forming members for electrophotography were prepared by carrying out formation of amorphous layers having the layer constitution as shown in FIG. 7 on Al cylinders by means of the preparation device as shown in FIG. 8, with the thicknesses of the layer region ($t_1 t_2$) and the layer region ($t_2 t_3$) being as parameters. The preparation conditions for respective layer regions constituting the amorphous layers are shown in Table 23 below.

Using the image forming members for electrophotography obtained, respectively, toner images were formed repeatedly on transfer papers by applying similarly the electrophotographic process as in Example 13, to obtain the evaluations as shown in Table 24.

TABLE 23

| Amorphous layer constitution | Gases employed (vol %) | Flow rate (SCCM) | Flow rate ratio | Layer formation rate (Å/S) | Layer thickness (μ) | Discharging power (W/cm²) | Substrate temperature (°C.) | Pressure during reaction (torr) |
|---|---|---|---|---|---|---|---|---|
| Layer region ($t_2t_B$) | $SiH_4/He = 0.5$<br>$NH_3$ 100<br>$B_2H_6/He = 3 \times 10^{-3}$ | $SiH_4 = 200$ | $NH_3/SiH_4 = 7.7 \times 10^{-2}$<br>$B_2H_6/SiH_4 = 8 \times 10^{-5}$ | 20 | 20 | 0.2 | 250 | 0.5 |
| Layer region ($t_1t_2$) | $SiH_4/He = 0.5$<br>$NH_3$ 100<br>$B_2H_6/He = 3 \times 10^{-3}$ | $SiH_4 = 200$ | $NH_3/SiH_4 = 7.7 \times 10^{-2} \sim$<br>$3.85 \times 10^{-2}$<br>$B_2H_6/SiH_4 = 8 \times 10^{-5} \sim 0$ | 20 | 0.5 | 0.2 | 250 | 0.5 |
| Layer region ($t_st_1$) | $SiH_4/He = 0.5$<br>$NH_3$ 100 | $SiH_4 = 200$ | $NH_3/SiH_4 =$<br>$3.85 \times 10^{-2} \sim 0$ | 20 | 0.5 | 0.2 | 250 | 0.5 |

Discharging frequency: 13.56 MHz

TABLE 24

| | Layer region ($t_1$ $t_2$) (μm) | | | | |
|---|---|---|---|---|---|
| Layer region ($t_s$ $t_2$) (μm) | 0.1<br>Sample No./<br>Evaluation | 0.5<br>Sample No./<br>Evaluation | 1.0<br>Sample No./<br>Evaluation | 4<br>Sample No./<br>Evaluation | 8<br>Sample No./<br>Evaluation |
| 0.1 | NS8-11<br>○ | NS8-12<br>○ | NS8-13<br>○ | NS8-14<br>○ | NS8-15<br>◎ |
| 0.2 | NS8-21<br>○ | NS8-22<br>◎ | NS8-23<br>◎ | NS8-24<br>◎ | NS8-25<br>◎ |
| 1.0 | NS8-31<br>○ | NS8-32<br>◎ | NS8-33<br>◎ | NS8-34<br>◎ | NS8-35<br>◎ |
| 4 | NS8-41<br>○ | NS8-42<br>◎ | NS8-43<br>◎ | NS8-44<br>◎ | NS8-45<br>◎ |
| 8 | NS8-51<br>◎ | NS8-52<br>◎ | NS8-53<br>◎ | NS8-54<br>◎ | NS8-55<br>◎ |

Evaluation standards are the same as in Table 2.

EXAMPLE 21

Image forming members for electrophotography were prepared by carrying out formation of amorphous layers having the layer constitution as shown in FIG. 2 on Al cylinders by means of the preparation device as shown in FIG. 8, with the contents of boron (B) and nitrogen (N) in the layers being as parameters. The preparation conditions for respective layer regions constituting the amorphous layers are shown in Table 25 below.

Using the image forming members for electrophotography obtained, toner images were formed repeatedly on transfer papers by applying similarly the electrophotographic process as in Example 13, whereby transferred toner images of high quality could be obtained stably.

tions as in Example 14, silicon carbide type surface barrier layers were formed on said amorphous layers in accordance with the conditions as shown below. The thus prepared samples were subjected to the electrophotographic process as in Example 13 repeatedly to obtain toner transferred images. As the result, even the one millionth toner transferred image was also found to be of very high quality, comparable to the first toner transferred image.

Gases employed . . . $CH_4$ $SiH_4/He = 10:250$
Flow rate . . . $SiH_4 = 10$ SCCM
Flow rate ratio . . . $CH_4/SiH_4 = 30$
Layer formation rate . . . 0.84 Å/sec
Discharging power . . . 0.18 W/cm²
Substrate temperature . . . 250° C.
Pressure during reaction . . . 0.5 Torr

EXAMPLE 23

TABLE 25

| Amorphous layer constitution | Gases employed (vol %) | Flow rate (SCCM) | Flow rate ratio | Layer formation rate (Å/S) | Layer thickness (μ) | Discharging power (W/cm²) | Substrate temperature (°C.) | Pressure during reaction (torr) |
|---|---|---|---|---|---|---|---|---|
| Layer region ($t_3t_B$) | $SiH_4/He = 0.5$<br>$NH_3$ 100<br>$B_2H_6/He = 3.3 \times 10^{-3}$ | $SiH_4 = 200$ | $NH_3/SiH_4 = 8 \times 10^{-2}$<br>$B_2H_6/SiH_4 = 5 \times 10^{-4}$ | 20 | 0.3 | 0.2 | 250 | 0.5 |
| Layer region ($t_1t_3$) | $SiH_4/He = 0.5$<br>$NH_3$ 100<br>$B_2H_6/He = 3.3 \times 10^{-3}$ | $SiH_4 = 200$ | $NH_3/SiH_4 = 8 \times 10^{-2}$<br>$B_2H_6/SiH_4 = 8 \times 10^{-5}$ | 20 | 20 | 0.2 | 250 | 0.5 |
| Layer region ($t_st_1$) | $SiH_4/He = 0.5$<br>$NH_3$ 100<br>$B_2H_6/He = 3.3 \times 10^{-3}$ | $SiH_4 = 200$ | $NH_3/SiH_4 = 8 \times 10^{-2} \sim 0$<br>$B_2H_6/SiH_4 = 8 \times 10^{-5} \sim 0$ | 20 | 1 | 0.2 | 250 | 0.5 |

Discharging frequency: 13.56 MHz

EXAMPLE 22

After amorphous layers having the layer constitution as shown in FIG. 3 were formed on Al cylinders according to the same procedures under the same condi- After amorphous layers were formed on Al cylinders according to the same procedures under the same conditions as in Samples Nos. NS4-1–NS4-4, NS5–NS5-9, NS6-1–NS6-6 and NS7-1–NS7-9 in Examples 16–19-silicon carbide type surface barrier layers were formed on respective amorphous layers in accordance with the same procedure and conditions as in Example 22 to obtain 28 samples (Sample Nos. NS11-1–NS11-28). For each of the samples, there was applied the electrophotographic process as in Example 13 to form repeatedly toner images on predetermined respective transfer papers, whereby toner images of high quality and high resolution could be obtained on all of the transfer papers.

on transfer papers by applying similar the electrophotographic process as in Example 13, whereby transferred toner images of high quality could be obtained stably.

TABLE 26

| Amorphous layer constitution | Gases employed (vol %) | Flow rate (SCCM) | Flow rate ratio | Layer formation rate (Å/S) | Layer thickness (μ) | Discharging power (W/cm$^2$) | Substrate temperature (°C.) | Pressure during reaction (torr) |
|---|---|---|---|---|---|---|---|---|
| Layer region ($t_2t_B$) | $SiH_4/He = 0.5$<br>$SiF_4/He$ 0.5<br>$NH_3 = 100$<br>$B_2H_6/He = 3 \times 10^{-3}$ | $SiH_4 = 200$ | $NH_3/(SiH_4 + SiF_4) = 8 \times 10^{-2}$<br>$SiF_4/SiH_4 = 0.2$<br>$B_2H_6/(SiH_4 + SiF_4) = 8 \times 10^{-5}$ | 20 | 20 | 0.18 | 250 | 0.5 |
| Layer region ($t_1t_2$) | $SiH_4/He = 0.5$<br>$SiF_4/He = 0.5$<br>$NH_3$ 100<br>$B_2H_6/He = 3 \times 10^{-3}$ | $SiH_4 = 200$ | $NH_3/(SiH_4 + SiF_4) = 8 \times 10^{-2} \sim 2 \times 10^{-2}$<br>$SiF_4/SiH_4 = 0.2$<br>$B_2H_6/(SiH_4 + SiF_4) = 8 \times 10^{-5}$ | 20 | 0.5 | 0.18 | 250 | 0.5 |
| Layer region ($t_st_1$) | $SiH_4/He = 0.5$<br>$SiF_3/He = 0.5$<br>$NH_3$ 100<br>$B_2H_6/He = 3 \times 10^{-3}$ | $SiH_4 = 200$ | $NH_3/(SiH_4 + SiF_4) = 2 \times 10^{-2} \sim 0$<br>$SiF_4/SiH_4 = 0.2$<br>$B_2H_6/(SiH_4 + SiF_4) = 8 \times 10^{-5} \sim 0$ | 20 | 0.5 | 0.18 | 250 | 0.5 |

Discharging frequency: 13.56 MHz

EXAMPLE 24

Imaging forming members for electrophotography were prepared by carrying out formation of amorphous layers having the layer constitution as shown in FIG. 3 on Al cylinders by means of the preparation device as shown in FIG. 8, with the contents of boron (B) and nitrogen (N) in the layers being as parameters. The preparation conditions for respective layer regions constituting the amorphous layers are shown in Table 26 below.

Using the image forming members for electrophotography obtained, toner images were formed repeatedly

EXAMPLE 25

Image forming members for electrophotography were prepared by carrying out formation of amorphous layers having the layer constitution as shown in FIG. 2 on Al cylinders by means of the preparation device as shown in FIG. 8, with the contents of boron (B) and carbon (C) in the layers being as parameters. The common preparation conditions are as shown in Table 27.

In Table 28, there are shown the results of evaluation for respective samples, with contents of boron $C_{(III)1}$ represented on the axis of ordinate and the contents of carbon $C_1$ on the axis of abscissa, respectively.

The image forming members for electrophotography prepared were subjected to a series of electrophotographic process of charging-imagewise exposure-development-transfer, and overall evaluations of the results with respect to density, resolution, toner reproducibility, etc. were performed for the images visualized on transfer papers.

TABLE 27

| Amorphous layer constitution | Gases employed (vol %) | Flow rate (SCCM) | Layer formation rate (Å/S) | Layer thickness (μ) | Discharging power (W/cm$^2$) | Substrate temperature (°C.) | Pressure during reaction (torr) | Discharging frequency (MHz) |
|---|---|---|---|---|---|---|---|---|
| Layer region ($t_1t_B$) | $SiH_4/He = 0.5$<br>$CH_4$ 100<br>$B_2H_6/He = 3 \times 10^{-3}$ | $SiH_4 = 200$ suitably changed depending on samples | 16 | 20 | 0.2 | 250 | 0.5 | 13.56 |
| Layer region ($t_st_1$) | $SiH_4/He = 0.5$<br>$CH_4$ 100<br>$B_2H_6/He = 3 \times 10^{-3}$ | $SiH_4 = 200$ suitably changed continuously | 16 | 1 | 0.2 | 250 | 0.5 | 13.56 |

TABLE 28

| | B distribution concentration $C_{(III)1}$ (atomic ppm) | | | | | | |
|---|---|---|---|---|---|---|---|
| C distribution concentration $C_1$ (atomic %) | 0.1<br>Sample No./<br>Evaluation | 0.5<br>Sample No./<br>Evaluation | 1<br>Sample No./<br>Evaluation | 5<br>Sample No./<br>Evaluation | 10<br>Sample No./<br>Evaluation | 30<br>Sample No./<br>Evaluation | 50<br>Sample No./<br>Evaluation |
| 0.01 | C1-1<br>Δ | C1-2<br>Δ | C1-3<br>○ | C1-4<br>○ | C1-5<br>○ | C1-6<br>Δ | C1-7<br>Δ |
| 0.03 | C2-1 | C2-2 | C2-3 | C2-4 | C2-5 | C2-6 | C2-7 |

TABLE 28-continued

| C distribution concentration C₁ (atomic %) | B distribution concentration C(IIⅠ) (atomic ppm) | | | | | | |
|---|---|---|---|---|---|---|---|
| | Sample No./Evaluation | | | | | | |
| 0.05 | C3-1 △ | C3-2 ○ | C3-3 ◎ | C3-4 ◎ | C3-5 ◎ | C3-6 ○ | C3-7 △ |
| 0.1 | C4-1 △ | C4-2 ○ | C4-3 ◎ | C4-4 ◎ | C4-5 ◎ | C4-6 ◎ | C4-7 ○ |
| 0.3 | C5-1 △ | C5-2 ○ | C5-3 ◎ | C5-4 ◎ | C5-5 ◎ | C5-6 ◎ | C5-7 ○ |
| 0.5 | C6-1 △ | C6-2 ○ | C6-3 ◎ | C6-4 ◎ | C6-5 ◎ | C6-6 ◎ | C6-7 ◎ |
| 1 | C7-1 △ | C7-2 ○ | C7-3 ◎ | C7-4 ◎ | C7-5 ◎ | C7-6 ◎ | C7-7 ◎ |
| 2 | C8-1 △ | C8-2 ○ | C8-3 ◎ | C8-4 ◎ | C8-5 ◎ | C8-6 ◎ | C8-7 ◎ |
| 3.5 | C9-1 △ | C9-2 ○ | C9-3 ◎ | C9-4 ◎ | C9-5 ◎ | C9-6 ◎ | C9-7 ◎ |
| 5 | C10-1 ○ | C10-2 ○ | C10-3 ◎ | C10-4 ◎ | C10-5 ◎ | C10-6 ◎ | C10-7 ◎ |
| 7 | C11-1 ○ | C11-2 ○ | C11-3 ○ | C11-4 ◎ | C11-5 ◎ | C11-6 ◎ | C11-7 ◎ |
| 10 | C12-1 △ | C12-2 ○ | C12-3 ○ | C12-4 ◎ | C12-5 ◎ | C12-6 ◎ | C12-7 ◎ |
| 20 | C13-1 △ | C13-2 △ | C13-3 ○ | C13-4 ○ | C13-5 ◎ | C13-6 ◎ | C13-7 ◎ |
| 30 | C14-1 △ | C14-2 △ | C14-3 △ | C14-4 ○ | C14-5 ○ | C14-6 ○ | C14-7 ○ |

| C distribution concentration C₁ (atomic %) | B distribution concentration C(IIⅠ) (atomic ppm) | | | | |
|---|---|---|---|---|---|
| | 80 Sample No./Evaluation | 100 Sample No./Evaluation | 200 Sample No./Evaluation | 400 Sample No./Evaluation | 800 Sample No./Evaluation |
| 0.01 | C1-8 △ | C1-9 △ | C1-10 △ | C1-11 △ | C1-12 △ |
| 0.03 | C2-8 △ | C2-9 △ | C2-10 △ | C2-11 △ | C2-12 △ |
| 0.05 | C3-8 △ | C3-9 △ | C3-10 △ | C3-11 △ | C3-12 △ |
| 0.1 | C4-8 ○ | C4-9 △ | C4-10 △ | C4-11 △ | C4-12 △ |
| 0.3 | C5-8 ○ | C5-9 ○ | C5-10 ○ | C5-11 △ | C5-12 △ |
| 0.5 | C6-8 ◎ | C6-9 ○ | C6-10 ○ | C6-11 △ | C6-12 △ |
| 1 | C7-8 ◎ | C7-9 ○ | C7-10 ○ | C7-11 △ | C7-12 △ |
| 2 | C8-8 ◎ | C8-9 ◎ | C8-10 ○ | C8-11 ○ | C8-12 △ |
| 3.5 | C9-8 ◎ | C9-9 ◎ | C9-10 ◎ | C9-11 ○ | C9-12 △ |
| 5 | C10-8 ◎ | C10-9 ◎ | C10-10 ○ | C10-11 ○ | C10-12 △ |
| 7 | C11-8 ◎ | C11-9 ◎ | C11-10 ○ | C11-11 △ | C11-12 △ |
| 10 | C12-8 ◎ | C12-9 ◎ | C12-10 ○ | C12-11 △ | C12-12 △ |
| 20 | C13-8 ○ | C13-9 ○ | C13-10 ○ | C13-11 △ | C13-12 △ |
| 30 | C14-8 △ | C14-9 △ | C14-10 △ | C14-11 △ | C14-12 △ |

Evaluation standards
◎ Excellent
○ Good
△ Practically satisfactory

EXAMPLE 26

Image forming members for electrophotography were prepared by carrying out formation of amorphous layers having the layer constitution as shown in FIG. 3 on Al cylinders by means of the preparation device as shown in FIG. 8, with the contents of boron (B) and carbon (C) in the layers being as parameters. The preparation conditions for respective layer constituting the amorphous layers are shown in Table 29 below.

Using the image forming members for electrophotography obtained, toner images were formed repeatedly on transfer papers by applying similarly the electrophotographic process as in Example 25, whereby transferred toner images of high quality could be obtained stably.

TABLE 29

| Amorphous layer constitution | Gases employed (vol %) | Flow rate (SCCM) | Flow rate ratio | Layer formation rate (Å/S) | Layer thickness (μ) | Discharging power (W/cm²) | Substrate temperature (°C.) | Pressure during reaction (torr) |
|---|---|---|---|---|---|---|---|---|
| Layer | $SiH_4/He = 0.5$ | $SiH_4 = 200$ | $CH_4/SiH_4 = 8 \times 10^{-2}$ | 20 | 20 | 0.18 | 250 | 0.5 |

TABLE 29-continued

| Amorphous layer constitution | Gases employed (vol %) | Flow rate (SCCM) | Flow rate ratio | Layer formation rate (Å/S) | Layer thickness ($\mu$) | Discharging power (W/cm$^2$) | Substrate temperature (°C.) | Pressure during reaction (torr) |
|---|---|---|---|---|---|---|---|---|
| region ($t_2t_B$) | CH$_4$ 100<br>B$_2$H$_6$/He = 3 × 10$^{-3}$ | | B$_2$H$_6$/SiH$_4$ = 8 × 10$^{-5}$ | | | | | |
| Layer region ($t_1t_2$) | SiH$_4$/He = 0.5<br>CH$_4$ 100<br>B$_2$H$_6$/He = 3 × 10$^{-3}$ | SiH$_4$ = 200 | CH$_4$/SiH$_4$ = 4 × 10$^{-2}$∼2 × 10$^{-2}$<br>B$_2$H$_6$/SiH$_4$ = 8 × 10$^{-5}$ | 20 | 0.5 | 0.18 | 250 | 0.5 |
| Layer region ($t_st_1$) | SiH$_4$/He = 0.5<br>CH$_4$ 100<br>B$_2$H$_6$/He = 3 × 10$^{-3}$ | SiH$_4$ = 200 | CH$_4$/SiH$_4$ = 2 × 10$^{-2}$∼0<br>B$_2$H$_6$/SiH$_4$ = 8 × 10$^{-4}$∼0 | 20 | 0.5 | 0.18 | 250 | 0.5 |

Discharging frequency: 13.56 MHz

EXAMPLE 27

Image forming members for electrophotography were prepared by carrying out formation of amorphous layers having the layer constitution as shown in FIG. 4 on Al cylinders by means of the preparation device as shown in FIG. 8, with the contents of boron (B) and carbon (C) in the layers being as parameters. The preparation conditions for respective layer constituting the amorphous layers are shown in Table 30 below.

Using the image forming members for electrophotography obtained, toner images were formed repeatedly on transfer papers by applying similarly the electrophotographic process as in Example 25, whereby transferred toner images of high quality could be obtained stably.

EXAMPLE 28

Image forming members for electrophotography were prepared by carrying out formation of amorphous layers having the layer constitution as shown in FIG. 5 on Al cylinders by means of the preparation device as shown in FIG. 8, with the contents of boron (B) and carbon (C) in the layers being as parameters.

The preparation conditions for respective layer regions constituting the amorphous layers are shown in Table 31 below.

Using the image forming members for electrophotography obtained, toner images were formed repeatedly on transfer papers by applying similarly the electrophotographic process as in Example 25, to obtain the evaluations as shown in Table 32.

In Table 32, X(4) means the following:

CS4-1 ... 1 × 10$^{-7}$   CS4-2 ... 5 × 10$^{-7}$
CS4-3 ... 1 × 10$^{-6}$   CS4-4 ... 5 × 10$^{-6}$

TABLE 30

| Amorphous layer constitution | Gases employed (vol %) | Flow rate (SCCM) | Flow rate ratio | Layer formation rate (Å/S) | Layer thickness ($\mu$) | Discharging power (W/cm$^2$) | Substrate temperature (°C.) | Pressure during reaction (torr) |
|---|---|---|---|---|---|---|---|---|
| Layer region ($t_2t_B$) | SiH$_4$/He = 0.5<br>CH$_4$ 100<br>B$_2$H$_6$/He = 3 × 10$^{-3}$ | SiH$_4$ = 200 | CH$_4$/SiH$_4$ = 1.5 × 10$^{-1}$<br>B$_2$H$_6$/SiH$_4$ = 3 × 10$^{-5}$ | 20 | 20 | 0.2 | 250 | 0.5 |
| Layer region ($t_1t_2$) | SiH$_4$/He = 0.5<br>CH$_4$ 100<br>B$_2$H$_6$/He = 3 × 10$^{-3}$ | SiH$_4$ = 200 | CH$_4$/SiH$_4$ = 1.5 × 10$^{-1}$<br>B$_2$H$_6$/SiH$_4$ = 3.0 × 10$^{-5}$∼1.5 × 10$^{-5}$ | 20 | 0.5 | 0.2 | 250 | 0.5 |
| Layer region ($t_st_1$) | SiH$_4$/He = 0.5<br>CH$_4$ 100<br>B$_2$H$_6$/He = 3 × 10$^{-3}$ | SiH$_4$ = 200 | CH$_4$/SiH$_4$ = 1.5 × 10$^{-1}$∼0<br>B$_2$H$_6$/SiH$_4$ = 1.5 × 10$^{-5}$∼0 | 20 | 0.5 | 0.2 | 250 | 0.5 |

Discharging frequency: 13.56 MHz

TABLE 31

| Amorphous layer constitution | Gases employed (vol %) | Flow rate (SCCM) | Flow rate ratio | Layer formation rate (Å/S) | Layer thickness ($\mu$) | Discharging power (W/cm$^2$) | Substrate temperature (°C.) | Pressure during reaction (torr) |
|---|---|---|---|---|---|---|---|---|
| Layer region ($t_2t_B$) | SiH$_4$/He = 0.5<br>CH$_4$ 100<br>B$_2$H$_6$/He = 3 × 10$^{-3}$ | SiH$_4$ = 200 | CH$_4$/SiH$_4$ = 1.5 × 10$^{-1}$<br>B$_2$H$_6$/SiH$_4$ = 5 × 10$^{-5}$ | 18 | 20 | 0.18 | 250 | 0.5 |
| Layer region ($t_1t_2$) | SiH$_4$/He = 0.5<br>CH$_4$ 100<br>B$_2$H$_6$/He = 3 × 10$^{-3}$ | SiH$_4$ = 200 | CH$_4$/SiH$_4$ = 1.5 × 10$^{-1}$∼5 × 10$^{-2}$<br>B$_2$H$_6$/SiH$_4$ = 1 × 10$^{-5}$ | 18 | 0.5 | 0.18 | 250 | 0.5 |
| Layer region ($t_st_1$) | SiH$_4$/He = 0.5<br>CH$_4$ 100<br>B$_2$H$_6$/He = 3 × 10$^{-3}$ | SiH$_4$ = 200 | CH$_4$/SiH$_4$ = 5 × 10$^{-2}$∼0<br>B$_2$H$_6$/SiH$_4$ = 1 × 10$^{-5}$∼X(4) | 18 | 0.3 | 0.18 | 250 | 0.5 |

Discharging frequency: 13.56 MHz

TABLE 32

| | B distribution concentration $C_{(III)3}$ (atomic ppm) | | | | | | | | |
|---|---|---|---|---|---|---|---|---|---|
| | 0.1 | 0.5 | 1 | 5 | 10 | 20 | 40 | 80 | 100 |
| Example | Sample No./ Evaluation | Sample No./ Evaluation | Sample No./ Evaluation | Sample No./ Evaluation | Sample No./ Evaluation | Sample No./ Evaluation | Sample No./ Evaluation | Sample No./ Evaluation | Sample No./ Evaluation |
| 30 | CS4-1 △ | CS4-2 ○ | CS4-3 ◎ | CS4-4 ◎ | | | | | |
| 31 | CS5-1 △ | CS5-2 ○ | CS5-3 ◎ | CS5-4 ◎ | CS5-5 ◎ | CS5-6 ◎ | CS5-7 ○ | CS5-8 △ | CS5-9 △ |
| 32 | CS6-1 ○ | CS6-2 ○ | CS6-3 ◎ | CS6-4 ◎ | CS6-5 ◎ | CS6-6 ◎ | | | |
| 33 | CS7-1 ○ | CS7-2 ○ | CS7-3 ◎ | CS7-4 ◎ | CS7-5 ◎ | CS7-6 ◎ | CS7-7 ○ | CS7-8 △ | CS7-9 △ |

Evaluation standards are the same as in Table 2.

EXAMPLE 29

Image forming members for electrophotography were prepared by carrying out formation of amorphous layers having the layer constitution as shown in FIG. 6 on Al cylinders by means of the preparation device as shown in FIG. 8, with the contents of boron (B) and carbon (C) in the layers being as parameters. The preparation conditions for respective layer regions constituting the amorphous layers are shown in Table 33 below.

Using the image forming members for electrophotography obtained, respectively, toner images were formed repeatedly on transfer papers by applying similarly the electrophotographic process as in Example 25, to obtain the evaluations as shown in Table 32.

In Table 33, X(5) means the following:

CS5-1 ... $1 \times 10^{-7}$   CS5-2 ... $5 \times 10^{-7}$
CS5-3 ... $1 \times 10^{-6}$   CS5-4 ... $5 \times 10^{-6}$
CS5-5 ... $1 \times 10^{-5}$   CS5-6 ... $2 \times 10^{-5}$
CS5-7 ... $3 \times 10^{-5}$   CS5-8 ... $4 \times 10^{-5}$
CS5-9 ... $6 \times 10^{-5}$

EXAMPLE 30

Image forming members for electrophotography were prepared by carrying out formation of amorphous layers having the layer constitution as shown in FIG. 5 on Al cylinders by means of the preparation device as shown in FIG. 8, with the contents of boron (B) and carbon (C) in the layers being as parameters.

The preparation conditions for respective layer constituting the amorphous layers are shown in Table 34 below.

Using the image forming members for electrophotography obtained, respectively, toner images were formed repeatedly on transfer papers by applying similarly the electrophotographic process as in Example 25, to obtain the evaluations as shown in Table 32.

In Table 34, X(6) means the following:

CS6-1 ... $1 \times 10^{-7}$   CS6-2 ... $5 \times 10^{-7}$
CS6-3 ... $1 \times 10^{-6}$   CS6-4 ... $5 \times 10^{-6}$
CS6-5 ... $1 \times 10^{-5}$   CS6-6 ... $2 \times 10^{-5}$

TABLE 33

| Amorphous layer constitution | Gases employed (vol %) | Flow rate (SCCM) | Flow rate ratio | Layer formation rate (Å/S) | Layer thickness (μ) | Discharging power (W/cm²) | Substrate temperature (°C.) | Pressure during reaction (torr) |
|---|---|---|---|---|---|---|---|---|
| Layer region ($t_2t_B$) | SiH₄/He = 0.5<br>CH₄ 100<br>B₂H₆/He = 3 × 10⁻³ | SiH₄ = 200 | CH₄/SiH₄ = 1.1 × 10⁻²<br>B₂H₆/SiH₄ = 8 × 10⁻⁵ | 20 | 20 | 0.2 | 250 | 0.5 |
| Layer region ($t_1t_2$) | SiH₄/He = 0.5<br>CH₄ 100<br>B₂H₆/He = 3 × 10⁻³ | SiH₄ = 200 | CH₄/SiH₄ =<br>1.1 × 10⁻² ~ 7.4 × 10⁻³<br>B₂H₆/SiH₄ =<br>8 × 10⁻⁵ ~ X(5) | 20 | 1.0 | 0.2 | 250 | 0.5 |
| Layer region ($t_s t_1$) | SiH₄/He = 0.5<br>CH₄ 100<br>B₂H₆/He = 3 × 10⁻³ | SiH₄ = 200 | CH₄/SiH₄ = 7.4 × 10⁻³ ~ 0<br>B₂H₆/SiH₄ = X(5) | 20 | 0.5 | 0.2 | 250 | 0.5 |

Discharging frequency: 13.56 MHz

TABLE 34

| Amorphous layer constitution | Gases employed (vol %) | Flow rate (SCCM) | Flow rate ratio | Layer formation rate (Å/S) | Layer thickness (μ) | Discharging power (W/cm²) | Substrate temperature (°C.) | Pressure during reaction (torr) |
|---|---|---|---|---|---|---|---|---|
| Layer region ($t_2t_B$) | SiH₄/He = 0.5<br>CH₄ 100<br>B₂H₆/He = 3 × 10⁻³ | SiH₄ = 200 | CH₄/SiH₄ = 2.2 × 10⁻²<br>B₂H₆/SiH₄ = 3 × 10⁻⁵ | 20 | 20 | 0.2 | 250 | 0.5 |
| Layer region ($t_1t_2$) | SiH₄/He = 0.5<br>CH₄ 100<br>B₂H₆/He = 3 × 10⁻³ | SiH₄ = 200 | CH₄/SiH₄ = 2.2 × 10⁻² ~<br>1.38 × 10⁻²<br>B₂H₆/SiH₄ = 3 × 10⁻⁵ | 20 | 0.5 | 0.2 | 250 | 0.5 |
| Layer region | SiH₄/He = 0.5<br>CH₄ 100 | SiH₄ = 200 | CH₄/SiH₄ = 1.38 × 10⁻² ~ 0<br>B₂H₆/SiH₄ = | 20 | 0.3 | 0.2 | 250 | 0.5 |

TABLE 34-continued

| Amorphous layer constitution | Gases employed (vol %) | Flow rate (SCCM) | Flow rate ratio | Layer formation rate (Å/S) | Layer thickness (μ) | Discharging power (W/cm²) | Substrate temperature (°C.) | Pressure during reaction (torr) |
|---|---|---|---|---|---|---|---|---|
| $(t_s t_1)$ | $B_2H_6/He = 3 \times 10^{-3}$ | | $3 \times 10^{-6} \sim X(6)$ | | | | | |

Discharging frequency: 13.56 MHz

EXAMPLE 31

Image forming members for electrophotography were prepared by carrying out formation of amorphous layers having the layer constitution as shown in FIG. 6 on Al cylinders by means of the preparation device as shown in FIG. 8, with the contents of boron (B) and carbon (C) in the layers being as parameters.

The preparation conditions for respective layer regions constituting the amorphous layers are shown in Table 35 below.

Using the image forming members for electrophotography obtained, respectively, toner images were formed repeatedly on transfer papers by applying similarly the electrophotographic process as in Example 25, to obtained the evaluations as shown in Table 32.

In Table 35, X(7) means the following:

| | |
|---|---|
| CS7-1 ... $1 \times 10^{-7}$ | CS7-2 ... $5 \times 10^{-7}$ |
| CS7-3 ... $1 \times 10^{-6}$ | CS7-4 ... $5 \times 10^{-6}$ |
| CS7-5 ... $1 \times 10^{-5}$ | CS7-6 ... $2 \times 10^{-5}$ |
| CS7-7 ... $4 \times 10^{-5}$ | CS7-8 ... $8 \times 10^{-5}$ |
| CS7-9 ... $1 \times 10^{-4}$ | |

TABLE 35

| Amorphous layer constitution | Gases employed (vol %) | Flow rate (SCCM) | Flow rate ratio | Layer formation rate (Å/S) | Layer thickness (μ) | Discharging power (W/cm²) | Substrate temperature (°C.) | Pressure during reaction (torr) |
|---|---|---|---|---|---|---|---|---|
| Layer region $(t_2 t_B)$ | $SiH_4/He = 0.5$<br>$CH_4$ 100<br>$B_2H_6/He = 3 \times 10^{-3}$ | $SiH_4 = 200$ | $CH_4/SiH_4 = 2.2 \times 10^{-2}$<br>$B_2H_6/SiH_4 = 2 \times 10^{-4}$ | 20 | 20 | 0.2 | 250 | 0.5 |
| Layer region $(t_1 t_2)$ | $SiH_4/He = 0.5$<br>$CH_4$ 100<br>$B_2H_6/He = 3 \times 10^{-3}$ | $SiH_4 = 200$ | $CH_4/SiH_4 = 2.2 \times 10^{-2} \sim$<br>$1.47 \times 10^{-2}$<br>$B_2H_6/SiH_4 =$<br>$2 \times 10^{-4} \sim X(7)$ | 20 | 0.3 | 0.2 | 250 | 0.5 |
| Layer region $(t_s t_1)$ | $SiH_4/He = 0.5$<br>$CH_4$ 100<br>$B_2H_6/He = 3 \times 10^{-3}$ | $SiH_4 = 200$ | $CH_4/SiH_4 =$<br>$1.47 \times 10^{-2} \sim 0$<br>$B_2H_6/SiH_4 = X(7)$ | 20 | 1.0 | 0.2 | 250 | 0.5 |

Discharging frequency: 13.56 MHz

EXAMPLE 32

Image forming members for electrophotography were prepared by carrying out formation of amorphous layers having the layer constitution as shown in FIG. 7 on Al cylinders by means of the preparation device as shown in FIG. 8, with the thicknesses of the layer region $(t_s t_1)$ and the layer region $(t_1 t_2)$ being as parameters. The preparation conditions for respective layer regions constituting the amorphous layers are shown in Table 36 below.

Using the image forming members for electrophotography obtained, respectively, toner images were formed repeatedly on transfer papers by applying similarly the electrophotographic process as in Example 25, to obtain the evaluations as shown in Table 37.

TABLE 36

| Amorphous layer constitution | Gases employed (vol %) | Flow rate (SCCM) | Flow rate ratio | Layer formation rate (Å/S) | Layer thickness (μ) | Discharging power (W/cm²) | Substrate temperature (°C.) | Pressure during reaction (torr) |
|---|---|---|---|---|---|---|---|---|
| Layer region $(t_2 t_B)$ | $SiH_4/He = 0.5$<br>$CH_4$ 100<br>$B_2H_6/He = 3 \times 10^{-3}$ | $SiH_4 = 200$ | $CH_4/SiH_4 = 7.7 \times 10^{-2}$<br>$B_2H_6/SiH_4 = 8 \times 10^{-5}$ | 20 | 20 | 0.2 | 250 | 0.5 |
| Layer region $(t_1 t_2)$ | $SiH_4/He = 0.5$<br>$CH_4$ 100<br>$B_2H_6/He = 3 \times 10^{-3}$ | $SiH_4 = 200$ | $CH_4/SiH_4 = 7.7 \times 10^{-2} \sim$<br>$3.85 \times 10^{-2}$<br>$B_2H_6/SiH_4 =$<br>$8 \times 10^{-5} \sim 0$ | 20 | Suitably changed depending on samples. | 0.2 | 250 | 0.5 |
| Layer region $(t_s t_1)$ | $SiH_4/He = 0.5$<br>$CH_4$ 100 | $SiH_4 = 200$ | $CH_4/SiH_4 =$<br>$3.85 \times 10^{-2} \sim 0$ | 20 | | 0.2 | 250 | 0.5 |

Discharging frequency: 13.56 MHz

TABLE 39

| Amorphous layer constitution | Gases employed (vol %) | Flow rate (SCCM) | Flow rate ratio | Layer formation rate (Å/S) | Layer thickness ($\mu$) | Discharging power (W/cm$^2$) | Substrate temperature (°C.) | Pressure during reaction (torr) |
|---|---|---|---|---|---|---|---|---|
| Layer region ($t_2t_B$) | SiH$_4$/He = 0.5<br>SiF$_4$/He = 0.5<br>CH$_4$ 100<br>B$_2$H$_6$/He = 3 × 10$^{-3}$ | SiH$_4$ = 200 | CH$_4$/(SiH$_4$ + SiF$_4$) = 4 × 10$^{-2}$<br>SiF$_4$/SiH$_4$ = 0.2<br>B$_2$H$_6$/(SiH$_4$ + SiF$_4$) = 8 × 10$^{-5}$ | 20 | 20 | 0.18 | 250 | 0.5 |
| Layer region ($t_1t_2$) | SiH$_4$/He = 0.5<br>SiF$_4$/He = 0.5<br>CH$_4$ 100<br>B$_2$H$_6$/He = 3 × 10$^{-3}$ | SiH$_4$ = 200 | CH$_4$/(SiH$_4$ + SiF$_4$) = 4 × 10$^{-2}$~2 × 10$^{-2}$<br>SiF$_4$/SiH$_4$ = 0.2<br>B$_2$H$_6$/(SiH$_4$ + SiF$_4$) = 8 × 10$^{-5}$ | 20 | 0.5 | 0.18 | 250 | 0.5 |
| Layer region ($t_st_1$) | SiH$_4$/He = 0.5<br>SiF$_4$/He = 0.5<br>CH$_4$ 100<br>B$_2$H$_6$He = 3 × 10$^{-3}$ | SiH$_4$ = 200 | CH$_4$/(SiH$_4$ + SiF$_4$) = 2 × 10$^{-2}$~0<br>SiF$_4$/SiH$_4$ = 0.2<br>B$_2$H$_6$/(SiH$_4$ + SiF$_4$) = 8 × 10$^{-5}$~0 | 20 | 0.5 | 0.18 | 250 | 0.5 |

Discharging frequency: 13.56 MHz

What we claim is:

1. A photoconductive member, comprising a support for a photoconductive member and an amorphous layer having photoconductivity constituted of an amorphous material comprising silicon atoms as a matrix and at least one of hydrogen atoms and halogen atoms, said amorphous layer having a first layer region containing at least one kind of atoms selected from the group consisting of oxygen atoms, carbon atoms and nitrogen atoms as constituent atoms in a distribution which is ununiform and continuous in the direction of layer thickness, the ununiform distribution being concentrated at the support side and decreasing towards the surface side of the amorphous layer and uniform and continuous substantially parallel to the surface of the amorphous layer and a second layer region containing atoms belonging to the group III of the periodic table as constituent atoms in a distribution which is ununiform and continuous in the direction of layer thickness.

2. A photoconductive member according to claim 1, wherein the first layer region and the second layer region share at least a part thereof.

3. A photoconductive member according to claim 1, wherein the first layer region and the second layer region are substantially the same layer region.

4. A photoconductive member according to claim 1, wherein said second region exists internally within said first layer region.

5. A photoconductive member according to claim 1, wherein the second layer region occupies substantially the entire layer region of the amorphous layer.

6. A photoconductive member according to claim 1, wherein oxygen atoms are contained in the first layer region.

7. A photoconductive member according to claim 6, wherein the distribution of oxygen atoms in the first layer is such that it is decreased toward the side opposite to the side on which the support is provided.

8. A photoconductive member according to claim 6, wherein the distribution of oxygen atoms in the first layer is such that it has a distribution region with higher concentration of oxygen atoms on the side of the support.

9. A photoconductive member according to claim 1, wherein nitrogen atoms are contained in the first layer region.

10. A photoconductive member according to claim 9, wherein the distribution of nitrogen atoms in the first layer is such that it is decreased toward the side opposite to the side on which the support is provided.

11. A photoconductive member according to claim 9, wherein the distribution of nitrogen atoms in the first layer is such that it has a distribution region with higher concentration of nitrogen atoms on the side of the support.

12. A photoconductive member according to claim 1, wherein carbon atoms are contained in the first layer region.

13. A photoconductive member according to claim 12, wherein the distribution of carbon atoms in the first layer is such that it is decreased toward the side opposite to the side on which the support is provided.

14. A photoconductive member according to claim 12, wherein the distribution of carbon atoms in the first layer is such that it has a distribution region with higher concentration of carbon atoms on the side of the support.

15. A photoconductive member according to claim 1, wherein oxygen atoms and nitrogen atoms are contained in the first layer region.

16. A photoconductive member according to claim 1, wherein oxygen atoms and carbon atoms are contained in the first layer region.

17. A photoconductive member according to claim 1, wherein carbon atoms and nitrogen atoms are contained in the first layer region.

18. A photoconductive member according to claim 1, wherein oxygen atoms, nitrogen atoms and carbon atoms are contained in the first layer region.

19. A photoconductive member according to claim 1, wherein hydrogen atoms are contained in the amorphous layer.

20. A photoconductive member according to claim 19, wherein the content of hydrogen atoms is 1 to 40 atomic %.

TABLE 37

| Layer region ($t_1t_2$) μm | Layer region ($t_st_1$) | | | | |
|---|---|---|---|---|---|
| | 0.1 Sample No./ Evaluation | 0.5 Sample No./ Evaluation | 1.0 Sample No./ Evaluation | 4 Sample No./ Evaluation | 8 Sample No./ Evaluation |
| 0.1 | CS8-11 ○ | CS8-12 ○ | CS8-13 ○ | CS8-14 ○ | CS8-15 ◎ |
| 0.2 | CS8-21 ○ | CS8-22 ◎ | CS8-23 ◎ | CS8-24 ◎ | CS8-25 ◎ |
| 1.0 | CS8-31 ○ | CS8-32 ◎ | CS8-33 ◎ | CS8-34 ◎ | CS8-35 ◎ |
| 4 | CS8-41 ○ | CS8-42 ◎ | CS8-43 ◎ | CS8-44 ◎ | CS8-45 ◎ |
| 8 | CS8-51 ◎ | CS8-52 ◎ | CS8-53 ◎ | CS8-54 ◎ | CS8-55 ◎ |

Evaluation standards are the same as in Table 2.

Evaluation standards are the same as in Table 2.

EXAMPLE 33

Image forming members for electrophotography were prepared by carrying out formation of amorphous layers having the layer constitution as shown in FIG. 2 on Al cylinders by means of the preparation device as shown in FIG. 8, with the contents of boron (B) and carbon (C) in the layers being as parameters. The preparation conditions for respective layer regions constituting the amorphous layers are shown in Table 38 below.

Using the image forming members for electrophotography obtained, toner images were formed repeatedly on transfer papers by applying similarly the electrophotographic process as in Example 25, whereby transferred toner images of high quality could be obtained stably.

TABLE 38

| Amorphous layer constitution | Gases employed (vol %) | Flow rate (SCCM) | Flow rate ratio | Layer formation rate (Å/S) | Layer thickness (μ) | Discharging power (W/cm$^2$) | Substrate temperature (°C.) | Pressure during reaction (torr) |
|---|---|---|---|---|---|---|---|---|
| Layer region ($t_3t_B$) | $SiH_4/He = 0.5$<br>$CH_4$ 100<br>$B_2H_6/He = 3.3 \times 10^{-3}$ | $SiH_4 = 200$ | $CH_4/SiH_4 = 4 \times 10^{-2}$<br>$B_2H_6/SiH_4 = 5 \times 10^{-4}$ | 20 | 0.3 | 0.2 | 250 | 0.5 |
| Layer region ($t_1t_2$) | $SiH_4/He = 0.5$<br>$CH_4$ 100<br>$B_2H_6/He = 3.3 \times 10^{-3}$ | $SiH_4 = 200$ | $CH_4/SiH_4 = 4 \times 10^{-2}$<br>$B_2H_6/SiH_4 = 8 \times 10^{-5}$ | 20 | 20 | 0.2 | 250 | 0.5 |
| Layer region ($t_st_1$) | $SiH_4/He = 0.5$<br>$CH_4$ 100<br>$B_2H_6/He = 3.3 \times 10^{-3}$ | $SiH_4 = 200$ | $CH_4/SiH_4 = 4 \times 10^{-2} \sim 0$<br>$B_2H_6/SiH_4 =$<br>$8 \times 10^{-5} \sim 0$ | 20 | 1 | 0.2 | 250 | 0.5 |

Discharging frequency: 13.56 MHz

EXAMPLE 34

After amorphous layers having the layer constitution as shown in FIG. 3 were formed on Al cylinders according to the same procedures under the same conditions as in Example 26, silicon carbide type surface barrier layers were formed on said amorphous layers in accordance with the conditions as shown below. The thus prepared samples were subjected to the electrophotographic process as in Example 25 repeatedly to obtain toner transferred images. As the result, even the one millionth toner transferred image was also found to be of very high quality, comparable to the first toner transferred image.

Gases employed . . . $CH_4SiH_4/He = 10:250$
Flow rate . . . $SiH_4 = 10$ SCCM
Flow rate ratio . . . $CH_4/SiH_4 = 30$
Layer formation rate . . . 0.84 Å/sec
Discharging power . . . 0.18 W/cm$^2$
Substrate temperature . . . 250° C.
Pressure during reaction . . . 0.5 Torr

EXAMPLE 35

After amorphous layers were formed on Al cylinders according to the same procedures under the same conditions as in Samples Nos. CS4-1-CS4-4, CS5-1-CS5-9, CS6-1-CS6-6 and CS7-1-CS7-9 in Examples 28-31, silicon carbide type surface barrier layers were formed on respective amorphous layers in accordance with the same procedure and conditions as in Example 34 to obtain 28 samples (Sample Nos. CS11-1-CS11-28). For each of the samples, there was applied the electrophotographic process as in Example 25 to form repeatedly toner images on predetermined respective transfer papers, whereby toner images of hiqh quality and high resolution could be obtained on all of the transfer papers.

EXAMPLE 36

Image forming members for electrophotography were prepared by carrying out formation of amorphous layers having the layer constitution as shown in FIG. 3 on Al cylinders by means of the preparation device as shown in FIG. 8, with the contents of boron (B) and carbon (C) in the layers being as parameters. The preparation conditions for respective layer regions constituting the amorphous layers are shown in Table 39 below.

Using the image forming members for electrophotography obtained, toner images were formed repeatedly on transfer papers by applying similarly the electrophotographic process as in Example 25, whereby transferred toner images of high quality could be obtained stably.

21. A photoconductive member according to claim 1, wherein halogen atoms are contained in the amorphous layer.

22. A photoconductive member according to claim 21, wherein the content of halogen atoms is 1 to 40 atomic %.

23. A photoconductive member according to claim 1, wherein hydrogen atoms and halogen atoms are contained in the amorphous layer.

24. A photoconductive member according to claim 23, wherein the sum of the contents of hydrogen atoms and halogen atoms is 1 to 40 atomic %.

25. A photoconductive member according to claim 1, further having a surface barrier layer on the amorphous layer.

26. A photoconductive member according to claim 1, wherein there is further provided on the amorphous layer a surface layer comprising an amorphous material containing silicon atoms as matrix and at least one kind of atoms selected from carbon atoms and nitrogen atoms.

27. A photoconductive member according to claim 26, wherein the amorphous material constituting the surface layer further contains hydrogen atoms.

28. A photoconductive member according to claim 26, wherein the amorphous material constituting the surface layer further contains halogen atoms.

29. A photoconductive member according to claim 26, wherein the amorphous material constituting the surface layer further contains hydrogen atoms and halogen atoms.

30. A photoconductive member according to claim 1, further having a surface layer constituted of an electrically insulating metal oxide.

31. A photoconductive member according to claim 1, further having a surface layer constituted of an electrically insulating organic compound.

32. A photoconductive member according to claim 1, wherein the atoms belonging to the group III of the periodic table are selected from the group consisting of B, Al, Ga, In, and Tl.

33. A photoconductive member according to claim 1, wherein the atoms belonging to the group III of the periodic table are contained in the second layer region in an amount of 0.01 to $5 \times 10^4$ atomic ppm.

34. A photoconductive member according to claim 1, wherein the atoms belonging to the group III of the periodic table are contained in the second layer region in an amount of 1 to 100 atomic ppm.

35. A photoconductive member according to claim 1, wherein the selected atoms are contained in the first layer region in an amount of 0.001 to 30 atomic %.

36. A photoconductive member according to claim 1, wherein the selected atoms are contained in the first layer region in an amount of 0.01 to 20 atomic %.

37. A photoconductive member according to claim 1, wherein the distribution concentration of the atoms belonging to the group III of the periodic table contained in the second layer region in the direction of layer thickness at the end point (tB) of the support side ranges 0.1 to $8 \times 10^4$ atomic ppm based on silicon atoms.

38. A photoconductive member according to claim 1, wherein the distribution concentration of the atoms belonging to the group III of the periodic table contained in the second layer region in the direction of layer thickness at the end point (tB) of the support side ranges 0.1 to 1000 atomic ppm based on silicon atoms.

39. A photoconductive member according to claim 1, wherein the distribution concentration of the selected atoms contained in the first layer region in the direction of layer thickness at the end point (tB) of the support side ranges 0.01 to 35 atomic %.

40. A photoconductive member according to claim 1, wherein the distribution concentration $C_1$ of the selected atoms contained in the first layer region in the direction of layer thickness at the end portion of said layer region on the support side is 0.01–30 atomic %.

41. A photoconductive member according to claim 1, wherein the distribution concentration line of the atoms belonging to the group III of the periodic table contained in the second layer region has a portion in which the concentration is continuously decreased toward the surface of said amorphous layer.

42. A photoconductive member according to claim 1, wherein the distribution concentration line of the selected atoms contained in the first layer region in the direction of layer thickness has a portion in which the concentration is continuously decreased toward the surface of said amorphous layer.

43. A photoconductive member according to claim 1, wherein the distribution concentration line of the atoms belonging to the group III of the periodic table contained in the second layer region in the direction of layer thickness has an even portion and uneven portion.

44. A photoconductive member according to claim 1, wherein the distribution concentration line of the selected atoms contained in the first layer region in the direction of layer thickness has an even portion and uneven portion.

45. A photoconductive member according to claim 1, wherein the first layer region has a region in which the selected atoms contained in said layer region is contained in a high concentration, at the end region on the support side.

46. A photoconductive member according to claim 45, wherein the layer thickness of the layer region containing the selected atoms in a high concentration is 50 Å–5µ.

47. A photoconductive member according to claim 1, wherein the layer thickness of the amorphous layer is 3–100µ.

48. A photoconductive member according to claim 1, wherein the support is in a belt like form.

49. A photoconductive member according to claim 1, wherein the support is in a cylindrical form.

50. A photoconductive member according to claim 1, wherein the support is provided with a synthetic resin film having electroconductivity at the surface.

51. A photoconductive member according to claim 25, wherein the thickness of the surface barrier layer ranges 30 Å to 5µ.

52. A photoconductive member according to claim 26, wherein the thickness of the surface layer ranges 30 Å to 5µ.

* * * * *

UNITED STATES PATENT AND TRADEMARK OFFICE
CERTIFICATE OF CORRECTION

PATENT NO. : 4,460,670

DATED : July 17, 1984

INVENTOR(S) : KYOSUKE OGAWA, ET AL.

It is certified that error appears in the above-identified patent and that said Letters Patent is hereby corrected as shown below:

IN THE ABSTRACT lines 9 and 13, change "ununiform" to --non-uniform--.

Col. 1, line 24, change "device it," to --device, it--;

line 30, change "is" to --are--.

Col. 2, line 32, after "cannot" insert --be--;

line 60, change "surpass" to --surpasses--.

Col. 3, line 39, change "ununiform" to --non-uniform--;

line 43, change "ununiform" to --non-uniform--;

line 52, after "7" insert --show--;

line 56, after "8" insert --shows--.

Col. 4, lines 21 and 39, change "ununiform" to --non-uniform--;

line 59, change "14" to --104--.

Col. 5, line 55, change "6" to --7--.

Col. 7, line 34, change "proivded" to --provided--.

Col. 9, line 16, change "ununiform" to --non-uniform--;

line 64, change "stoms" to --atoms--.

Col. 13, line 65, change "Otherwide" to --Otherwise--.

UNITED STATES PATENT AND TRADEMARK OFFICE
CERTIFICATE OF CORRECTION

PATENT NO. : 4,460,670
DATED : July 17, 1984
INVENTOR(S) : KYOSUKE OGAWA, ET AL.

It is certified that error appears in the above-identified patent and that said Letters Patent is hereby corrected as shown below:

Col. 14, line 1, change "$(F_2N_2)$" to --$(F_4N_2)$--;

line 24, after "introduction" insert --of--;

line 52, change "starging" to --starting--.

Col. 18, line 11, after "generally" insert --be--;

line 14, change "interms" to --in terms--.

Col. 20, lines 16/17, change "amorhpous" to --amorphous--.

Col. 22, in the heading of Table 1, change "A/S" to --$\overset{\circ}{A}/S$--.

Col. 23, at the end of Table 2, under "Evaluation standards", before "Excellent" insert --⊚--;

before "Good" insert --0--.

Col. 26, in Table 6, under the heading "20 Sample No./

Evaluation", under "S5-6" insert --0--;

under "S5-7" insert --0--.

Col. 31, line 30, change "$CH_4SH_4/He$" to --$CH_4\ SH_4/He$--.

Col. 35, at the end of Table 15, under "Evaluation standards", before "Excellent" insert --⊚--;

before "Good" insert --0--;

UNITED STATES PATENT AND TRADEMARK OFFICE
CERTIFICATE OF CORRECTION

PATENT NO. : 4,460,670
DATED : July 17, 1984
INVENTOR(S) : KYOSUKE OGAWA, ET AL.

It is certified that error appears in the above-identified patent and that said Letters Patent is hereby corrected as shown below:

in Table 16, first column, "Layer region $t_2 t_B$ (second occurrence down, should read --Layer region $t_1 t_2$--.

in Table 16, under the column headed "Gases employed", change "$B_2H_6$/He" (both occurrences).

Col. 36, line 18, after "layer" insert --regions--.

Col. 42, line 41, change "$CH_4 SiH_4$/He" to --$Ch_4$ $SiH_4$/He--.

Col. 44, line 1, change "similar" to --similarly--.

Col. 43, in Table 26, under the heading "Gases employed", change "$SiF_4$/He05" to --$SiF_4$/He = 0.5--.

Col. 45, at the end of Table 28, under "Evaluation standards", before "Excellent" insert --◎--; before "Good" insert --O--.

Col. 46, line 54, after "layer" insert --regions--.

UNITED STATES PATENT AND TRADEMARK OFFICE
CERTIFICATE OF CORRECTION

PATENT NO. : 4,460,670
DATED : July 17, 1984
INVENTOR(S) : KYOSUKE OGAWA, ET AL.

It is certified that error appears in the above-identified patent and that said Letters Patent is hereby corrected as shown below:

Col. 47, in Table 29, under the heading "Flow rate ratio", last line, change "$8 \times 10^{-4} \sim 10$" to $--8 \times 10^5 \sim 10--$.

line 24, after "layer" insert --regions--.

Col. 50, line 25, after "layer" insert --regions--.

Col. 51, lines 43/44, change "obtained" to --obtain--.

Col. 53, line 16, delete 2nd enlarged printing "Evaluation standards are the same as in Table 2."

Col. 53, in the first column of Table 38, change "Layer region $t_1t_2$" to --Layer region $t_1t_3$--;

line 65, change "$CH_4SiH_4/He$" to --$CH_4\ SiH_4/He$--.

UNITED STATES PATENT AND TRADEMARK OFFICE
CERTIFICATE OF CORRECTION

PATENT NO. : 4,460,670

DATED : July 17, 1984

INVENTOR(S) : KYOSUKE OGAWA, ET AL.

It is certified that error appears in the above-identified patent and that said Letters Patent is hereby corrected as shown below:

IN THE CLAIMS

Claim 1, lines 31, 32 and 40, change "ununiform" to --non-uniform--.

Signed and Sealed this

Eleventh Day of June 1985

[SEAL]

Attest:

DONALD J. QUIGG

Attesting Officer

Acting Commissioner of Patents and Trademarks